United States Patent
Shimizu

(10) Patent No.: US 11,923,420 B2
(45) Date of Patent: Mar. 5, 2024

(54) SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

(71) Applicant: KABUSHIKI KAISHA TOSHIBA, Tokyo (JP)

(72) Inventor: Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 18/157,423

(22) Filed: Jan. 20, 2023

(65) Prior Publication Data

US 2023/0154988 A1    May 18, 2023

Related U.S. Application Data

(62) Division of application No. 16/992,172, filed on Aug. 13, 2020, now Pat. No. 11,588,023.

(30) Foreign Application Priority Data

Mar. 13, 2020  (JP) ................. 2020-044566

(51) Int. Cl.
*H01L 29/16* (2006.01)
*H01L 29/08* (2006.01)
(Continued)

(52) U.S. Cl.
CPC ...... *H01L 29/1608* (2013.01); *H01L 29/0878* (2013.01); *H01L 29/41725* (2013.01); *H01L 29/456* (2013.01)

(58) Field of Classification Search
CPC ............ H01L 29/1608; H01L 29/0878; H01L 29/41725; H01L 29/456; H01L 21/0485;
(Continued)

(56) References Cited

U.S. PATENT DOCUMENTS

| | | |
|---|---|---|
| 2007/0138482 A1 | 6/2007 | Tanimoto |
| 2009/0072244 A1 | 3/2009 | Harada et al. |

(Continued)

FOREIGN PATENT DOCUMENTS

| | | |
|---|---|---|
| JP | 2003-243323 A | 8/2003 |
| JP | 2005-109504 A | 4/2005 |

(Continued)

OTHER PUBLICATIONS

Rupp et al., "Laser backside contact annealing of SiC Power devices: A Prerequisite for SiC thin wafer technology", Proceedings of the 25th International Symposium on Power Semiconductor Devices & ICs, 2013, pp. 51-54.

*Primary Examiner* — Jonathan Han
(74) *Attorney, Agent, or Firm* — Oblon, McClelland, Maier & Neustadt, L.L.P.

(57) ABSTRACT

A semiconductor device according to an embodiment includes: a silicon carbide layer; a metal layer; and a conductive layer positioned between the silicon carbide layer and the metal layer, the conductive layer containing a silicide of one metal element (M) selected from the group consisting of nickel (Ni), palladium (Pd), and platinum (Pt), and the conductive layer having a carbon concentration of $1 \times 10^{17}$ cm$^{-3}$ or less.

8 Claims, 38 Drawing Sheets

(51) Int. Cl.
*H01L 29/417* (2006.01)
*H01L 29/45* (2006.01)

(58) Field of Classification Search
CPC ............ H01L 29/0623; H01L 29/1095; H01L 29/41766; H01L 29/45; H01L 29/66068; H01L 29/7802; H01L 29/7813
See application file for complete search history.

(56) References Cited

U.S. PATENT DOCUMENTS

| | | | |
|---|---|---|---|
| 2013/0062624 A1* | 3/2013 | Tsuchiya | H01L 29/861 |
| | | | 257/E21.409 |
| 2013/0234159 A1* | 9/2013 | Tsuchiya | H01L 29/7395 |
| | | | 257/77 |
| 2017/0033185 A1* | 2/2017 | Shimizu | H01L 29/7397 |
| 2017/0077238 A1 | 3/2017 | Kono et al. | |
| 2018/0308935 A1* | 10/2018 | Shimizu | H01L 29/872 |
| 2018/0308936 A1* | 10/2018 | Shimizu | H01L 29/1608 |
| 2018/0323261 A1 | 11/2018 | Kawai et al. | |

FOREIGN PATENT DOCUMENTS

| | | |
|---|---|---|
| JP | 2006-24880 A | 1/2006 |
| JP | 3871607 B2 | 1/2007 |
| JP | 2007-184571 A | 7/2007 |
| JP | 2007-242744 A | 9/2007 |
| JP | 5655642 B2 | 1/2015 |
| JP | 2017-059600 A | 3/2017 |
| JP | 2017-199807 A | 11/2017 |
| JP | 2018-82190 A | 5/2018 |
| JP | 2018-186126 A | 11/2018 |
| WO | WO 2015/159984 A1 | 10/2015 |

\* cited by examiner

SEMICONDUCTOR DEVICE, METHOD FOR MANUFACTURING SEMICONDUCTOR DEVICE, INVERTER CIRCUIT, DRIVING DEVICE, VEHICLE, AND ELEVATOR

CROSS-REFERENCE TO RELATED APPLICATION

This application is a division of and claims benefit under 35 U.S.C. § 120 to U.S. application Ser. No. 16/992,172, filed Aug. 13, 2020, which is based upon and claims the benefit of priority under 35 U.S.C. § 119 to Japanese Patent Application No. 2020-044566, filed on Mar. 13, 2020, the entire contents of which are incorporated herein by reference.

FIELD

Embodiments described herein relate generally to a semiconductor device, a method for manufacturing a semiconductor device, an inverter circuit, a driving device, a vehicle, and an elevator.

BACKGROUND

Silicon carbide (SiC) has been expected as a material for next generation semiconductor devices. As compared with silicon (Si), silicon carbide has superior physical properties that a band gap is about three times of that of Si, a breakdown field strength is about ten times of that of Si, and a thermal conductivity is about three times of that of Si. These characteristics are used to achieve a semiconductor device capable of operating with a low loss at high temperature.

In a device using silicon carbide, a metal silicide layer may be provided between a silicon carbide layer and a metal electrode in order to reduce a contact resistance between the silicon carbide layer and the metal electrode. The metal silicide layer is formed by causing the silicon carbide layer to react with a metal film.

When forming the metal silicide layer, excess carbon in the silicon carbide layer is precipitated as a carbon cluster. The carbon cluster is precipitated at an interface between the silicon carbide layer and the metal silicide layer, in the metal silicide layer, or at an interface between the metal silicide layer and the metal electrode. A large amount of the carbon cluster increases the contact resistance between the silicon carbide layer and the metal electrode.

DETAILED DESCRIPTION

Figure 1:
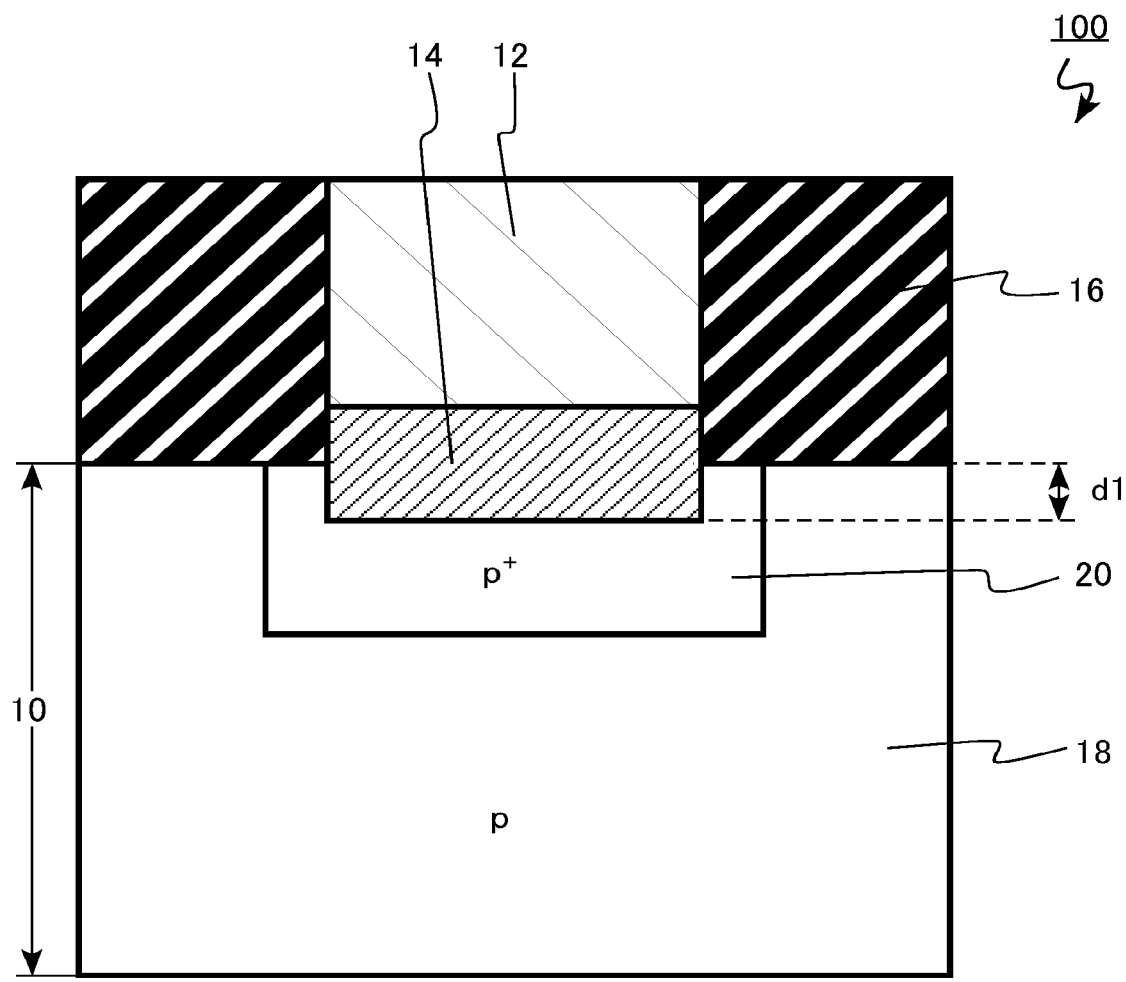
FIG. 1 is a schematic cross-sectional view of a semiconductor device of a first embodiment.

A semiconductor device according to an embodiment includes: a silicon carbide layer; a metal layer; and a conductive layer positioned between the silicon carbide layer and the metal layer, the conductive layer containing a silicide of one metal element (M) selected from the group consisting of nickel (Ni), palladium (Pd), and platinum (Pt), and the conductive layer having a carbon concentration of $1 \times 10^{17}$ cm$^{-3}$ or less.

Hereinafter, embodiments of the present disclosure will be described with reference to the drawings. In the following description, the same or equivalent members and the like will be denoted by the same reference numerals, and members that have been once described will not be described as appropriate.

In the following description, notations n$^+$, n, n$^-$, p$^+$, p, and p$^-$ indicate relative levels of impurity concentration in each conductivity type. That is, n$^+$ indicates an n-type impurity concentration higher than that of n, and n$^-$ indicates an n-type impurity concentration lower than that of n. In addition, p$^+$ indicates a p-type impurity concentration higher than that of p, and p$^-$ indicates a p-type impurity concentration lower than that of p. In some cases, an n$^+$-type and an n$^-$-type are simply referred to as an n-type, and a p$^+$-type and a p$^-$-type are simply referred to as a p-type. Unless otherwise specified, the impurity concentration of each region is represented by, for example, a value of an impurity concentration at the center of each region.

The impurity concentration can be measured by secondary ion mass spectrometry (SIMS), for example. In addition, a relative level of the impurity concentration can also be determined based on a level of a carrier concentration obtained by, for example, scanning capacitance microscopy (SCM). In addition, a distance such as a width and a depth of an impurity region can be obtained by SIMS, for example.

In addition, a distance such as a width and a depth of an impurity region can be obtained from an SCM image, for example.

A depth of a trench, a thickness of an insulating layer, and the like can be measured on an image of SIMS or a transmission electron microscope (TEM), for example.

For example, X-ray photoelectron spectroscopy (XPS), infrared spectroscopy, or Raman spectroscopy is used to identify silicide phases existing in a metal silicide layer and to determine a magnitude relationship of the amount of the silicide phases existing in the metal silicide layer.

First Embodiment

A semiconductor device according to a first embodiment includes: a silicon carbide layer; a metal layer; and a conductive layer positioned between the silicon carbide layer and the metal layer, the conductive layer containing a silicide of one metal element (M) selected from the group consisting of nickel (Ni), palladium (Pd), and platinum (Pt), and the conductive layer having a carbon concentration of $1 \times 10^{17}$ cm$^{-3}$ or less.

FIG. 1 is a schematic cross-sectional view of the semiconductor device of the first embodiment. The semiconductor device of the first embodiment is a semiconductor device including a contact structure 100.

The contact structure 100 includes a silicon carbide layer 10, a contact electrode 12 (metal layer), a metal silicide layer 14 (conductive layer), and an insulating layer 16.

The silicon carbide layer 10 has a low-concentration p-type region 18 and a high-concentration p-type region 20.

The silicon carbide layer 10 is a single crystal of, for example, a 4H—SiC. The silicon carbide layer 10 contains an impurity. The silicon carbide layer 10 contains a p-type impurity.

The low-concentration p-type region 18 of the silicon carbide layer 10 contains a p-type impurity. The low-concentration p-type region 18 contains, for example, aluminum (Al) or boron (B) as the p-type impurity. A p-type impurity concentration of the low-concentration p-type region 18 is, for example, $1 \times 10^{16}$ cm$^{-3}$ or more and $1 \times 10^{18}$ cm$^{-3}$ or less.

The high-concentration p-type region 20 of the silicon carbide layer 10 contains a p-type impurity. The high-concentration p-type region 20 contains, for example, aluminum (Al) or boron (B) as the p-type impurity. A p-type impurity concentration of the high-concentration p-type region 20 is higher than the p-type impurity concentration of the low-concentration p-type region 18. The p-type impurity concentration of the high-concentration p-type region 20 is, for example, $1 \times 10^{19}$ cm$^{-3}$ or more and $1 \times 10^{22}$ cm$^{-3}$ or less.

The contact electrode 12 is positioned on a front surface side of the silicon carbide layer 10. The contact electrode 12 is an example of a metal layer.

The contact electrode 12 contains metal. The contact electrode 12 is, for example, aluminum, an aluminum alloy, tungsten, or copper.

The contact electrode 12 may include, for example, a barrier metal film (not illustrated) between the contact electrode 12 and the metal silicide layer 14. The barrier metal film is, for example, titanium or titanium nitride.

A carbon concentration of the contact electrode 12 is, for example, $1 \times 10^{17}$ cm$^{-3}$ or less.

The metal silicide layer 14 is provided between the silicon carbide layer 10 and the contact electrode 12. The metal silicide layer 14 is an example of a conductive layer. The metal silicide layer 14 is in contact with the silicon carbide layer 10. The metal silicide layer 14 is in contact with the contact electrode 12.

The metal silicide layer 14 contains a silicide of one metal element (M) selected from the group consisting of nickel (Ni), palladium (Pd), and platinum (Pt). The metal silicide layer 14 contains a nickel silicide, a palladium silicide, or a platinum silicide. The metal silicide layer 14 is, for example, a nickel silicide, a palladium silicide, or a platinum silicide.

A carbon concentration of the metal silicide layer 14 is $1 \times 10^{17}$ cm$^{-3}$ or less.

An atomic ratio (M/Si) of the metal element (M) to silicon (Si) in the metal silicide layer 14 is 1.2 or more, for example. For example, it is assumed that the metal silicide layer 14 is a nickel silicide. Nickel has silicide phases represented by composition formulas of $Ni_{31}Si_{12}$, $Ni_2Si$, $NiSi$, and $NiSi_2$. Atomic ratios (Ni/Si) of nickel to silicon (Si) of $Ni_{31}Si_{12}$, $Ni_2Si$, $NiSi$, and $NiSi_2$ are 2.6, 2.0, 1.0, and 0.5, respectively.

A p-type impurity concentration of the metal silicide layer 14 is, for example, $1 \times 10^{17}$ cm$^{-3}$ or less. An aluminum concentration of the metal silicide layer 14 is, for example, $1 \times 10^{17}$ cm$^{-3}$ or less. A boron concentration of the metal silicide layer 14 is, for example, $1 \times 10^{17}$ cm$^{-3}$ or less.

A thickness of the metal silicide layer 14 in a direction normal to the front surface of the silicon carbide layer 10 is, for example, 50 nm or more and 500 nm or less.

The insulating layer 16 is positioned on the front surface side of the silicon carbide layer 10. The insulating layer 16 is provided on the side of the silicon carbide layer 10 where the contact electrode 12 is positioned. The insulating layer 16 is in contact with the silicon carbide layer 10.

The insulating layer 16 is, for example, silicon oxide.

The contact electrode 12 is formed inside an opening formed in the insulating layer 16, for example.

A depth (d1 in FIG. 1) of an interface between the silicon carbide layer 10 and the metal silicide layer 14 is, for example, 50 nm or more and 500 nm or less. In the first embodiment, the "depth" is a depth when an interface between the silicon carbide layer 10 and the insulating layer 16 is set as a reference.

Figure 2:
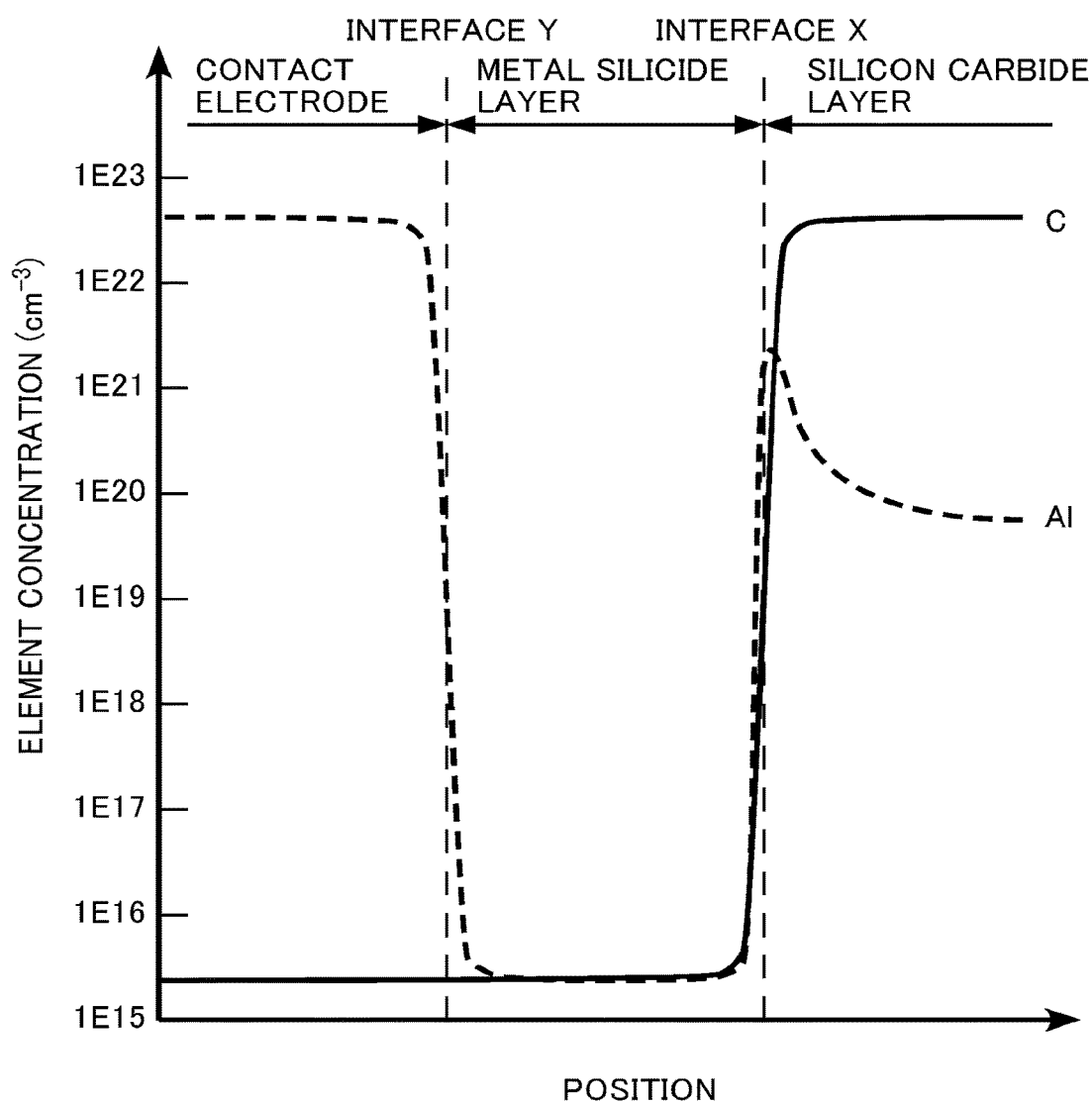
FIG. 2 is a graph illustrating element concentration distributions of the semiconductor device of the first embodiment.

FIG. 2 is a graph illustrating element concentration distributions of the semiconductor device of the first embodiment. FIG. 2 is a graph illustrating the element concentration distributions in the contact electrode 12, the metal silicide layer 14, and the silicon carbide layer 10. FIG. 2 is a graph illustrating the element distribution of the contact structure 100 in the direction normal to the front surface of the silicon carbide layer 10. FIG. 2 illustrates a case where the p-type impurity contained in the silicon carbide layer is aluminum (Al) and the contact electrode 12 contains aluminum.

A carbon concentration of the metal silicide layer 14 is $1 \times 10^{17}$ cm$^{-3}$ or less. The carbon concentration of the metal silicide layer 14 is $1 \times 10^{16}$ cm$^{-3}$ or less.

For example, the carbon concentration of the metal silicide layer 14 is represented by a carbon concentration of a region separated by a predetermined distance or more from an interface (interface X in FIG. 2) between the silicon carbide layer 10 and the metal silicide layer 14 and an interface (interface Y in FIG. 2) between the contact electrode 12 and the metal silicide layer 14. The predetermined distance is, for example, 10 nm. The carbon concentration of the metal silicide layer 14 is represented by, for example, a carbon concentration of a central portion of the metal silicide layer 14.

The carbon concentration of the contact electrode 12 is $1 \times 10^{17}$ cm$^{-3}$ or less. A carbon concentration of the contact electrode 12 may be $1 \times 10^{16}$ cm$^{-3}$ or less.

The carbon concentration of the contact electrode 12 is represented by, for example, a carbon concentration of a region separated by a predetermined distance or more from the interface (interface Y in FIG. 2) between the contact electrode 12 and the metal silicide layer 14. The predetermined distance is, for example, 10 nm.

A concentration distribution of aluminum in the silicon carbide layer 10 and the metal silicide layer 14 has a peak at the interface (interface X in FIG. 2) between the silicon carbide layer 10 and the metal silicide layer 14. An aluminum concentration at the peak of the aluminum concentration distribution is, for example, $1 \times 10^{19}$ cm$^{-3}$ or more and $1 \times 10^{23}$ cm$^{-3}$ or less. The aluminum concentration at the peak is one digit or more higher than the aluminum concentration in the silicon carbide layer 10 ($1 \times 10^{18}$ cm$^{-3}$ or more and $1 \times 10^{22}$ cm$^{-3}$ or less).

The aluminum concentration of the metal silicide layer 14 is $1 \times 10^{17}$ cm$^{-3}$ or less. The aluminum concentration of the metal silicide layer 14 may be $1 \times 10^{16}$ cm$^{-3}$ or less.

For example, the aluminum concentration of the metal silicide layer 14 is represented by an aluminum concentration of a region separated by a predetermined distance or more from an interface (interface X in FIG. 2) between the silicon carbide layer 10 and the metal silicide layer 14 and an interface (interface Y in FIG. 2) between the contact electrode 12 and the metal silicide layer 14. The predetermined distance is, for example, 10 nm. The aluminum concentration of the metal silicide layer 14 is represented by, for example, an aluminum concentration of a central portion of the metal silicide layer 14.

Next, an example of a method for manufacturing the semiconductor device of the first embodiment will be described. A method for manufacturing the contact structure 100 will be described. FIGS. 3, 4, 5, 6, 7, and 8 are schematic cross-sectional views illustrating the method for manufacturing the semiconductor device of the first embodiment.

The method for manufacturing the semiconductor device of the first embodiment includes: forming a first metal film on a silicon carbide layer, the first metal film containing one metal element (M) selected from a group consisting of nickel (Ni), palladium (Pd), and platinum (Pt); performing heat treatment in an atmosphere containing at least any one of carbon dioxide and atomic hydrogen and causing the silicon carbide layer to react with the first metal film to form a metal silicide film containing the metal element; and forming a second metal film having a chemical composition different from a chemical composition of the first metal film on the metal silicide film. Hereinafter, a case where the metal element is nickel (Ni) will be described as an example.

Figure 3:
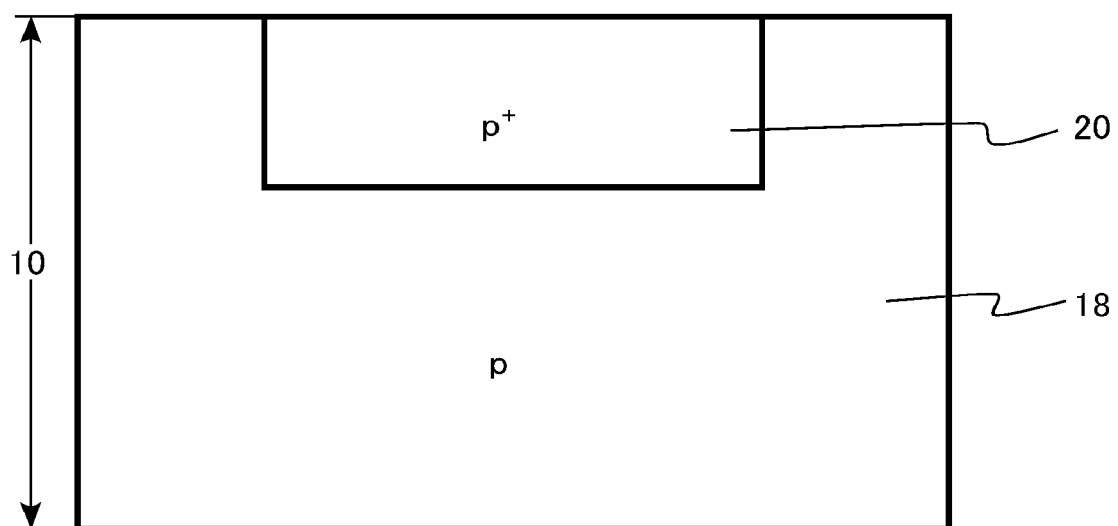
FIG. 3 is a schematic cross-sectional view illustrating a method for manufacturing the semiconductor device of the first embodiment.

First, the silicon carbide layer 10 having the high-concentration p-type region 20 formed on the low-concentration p-type region 18 is prepared (FIG. 3). The high-concentration p-type region 20 is formed, for example, by ion-implanting a p-type impurity into the p-type region 18. The p-type impurity is, for example, aluminum (Al).

Figure 4:
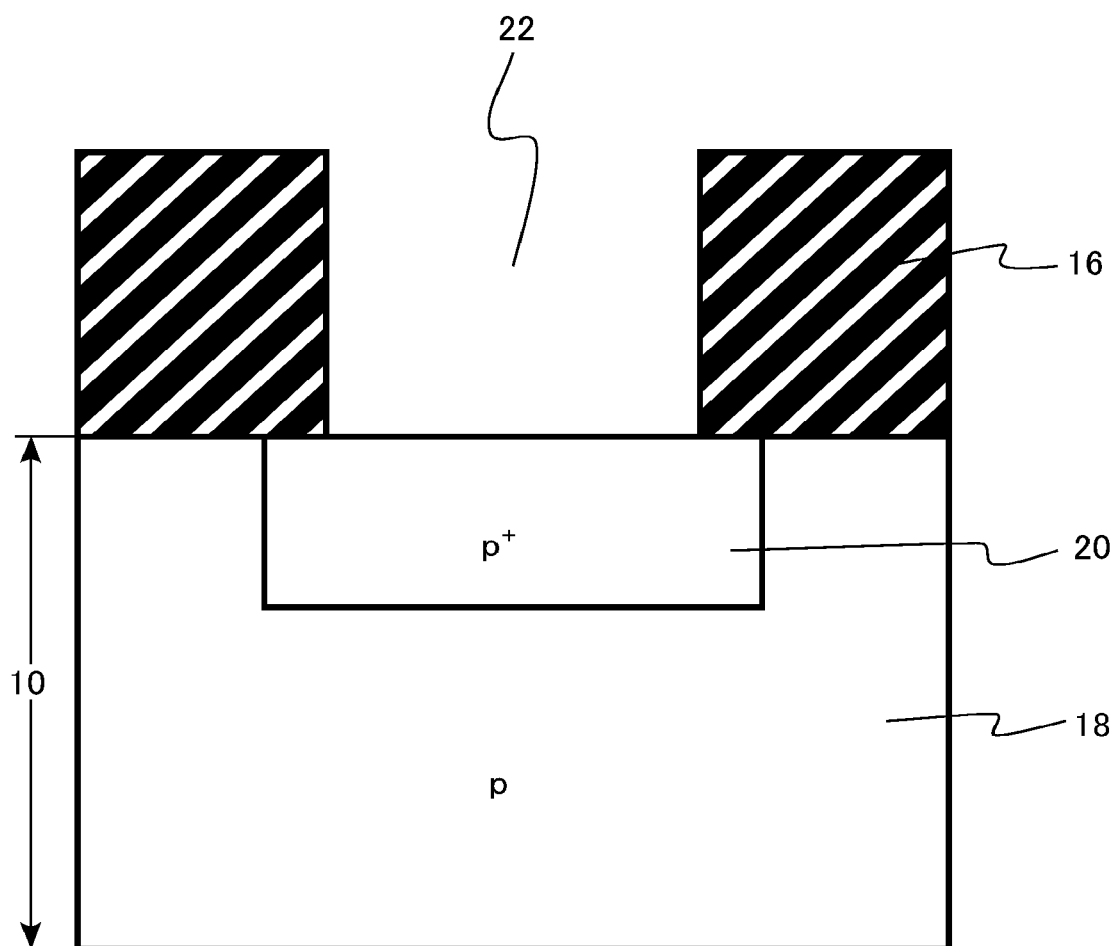
FIG. 4 is a schematic cross-sectional view illustrating the method for manufacturing the semiconductor device of the first embodiment.

Next, the patterned insulating layer 16 is formed on the silicon carbide layer 10 (FIG. 4). The insulating layer 16 has, for example, an opening 22.

The insulating layer 16 is formed using, for example, a chemical vapor deposition method (CVD method). The opening 22 is formed using, for example, a lithography method and a reactive ion etching method (RIE method).

Figure 5:
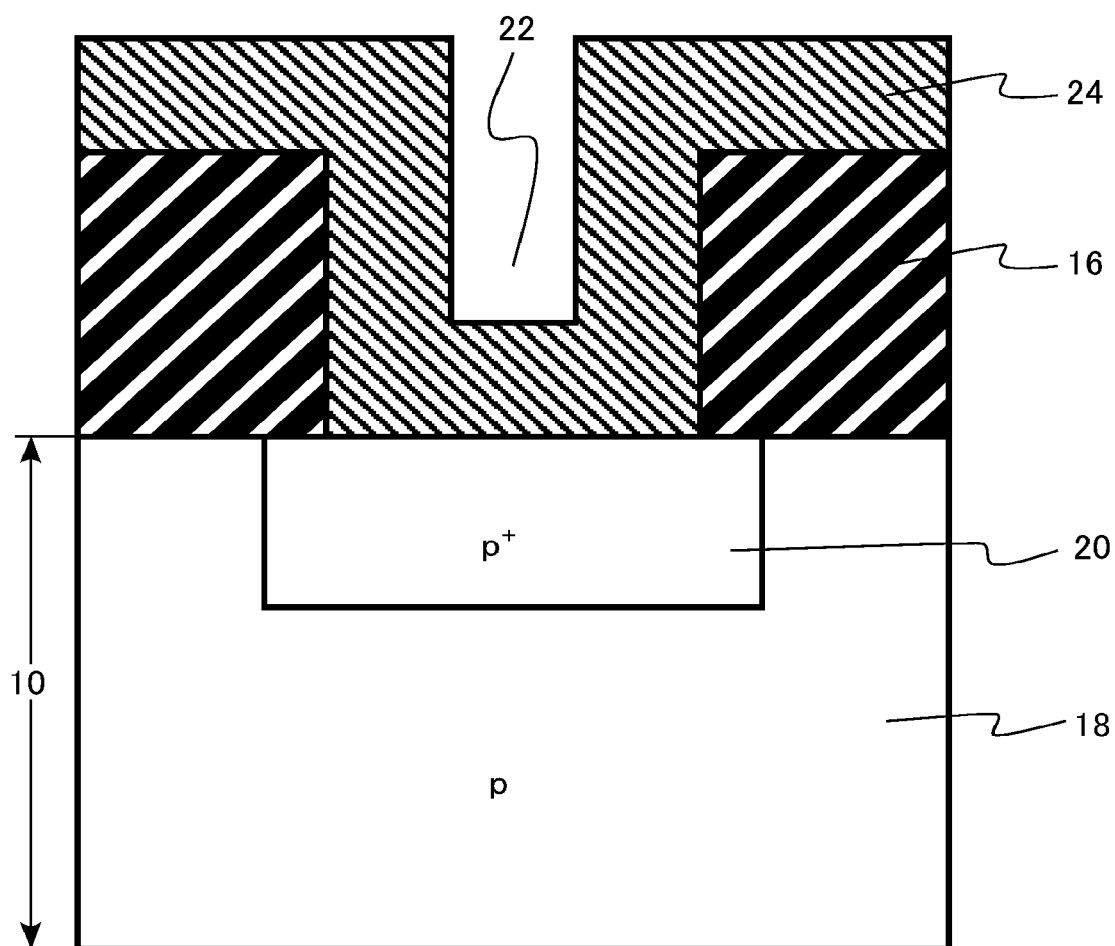
FIG. 5 is a schematic cross-sectional view illustrating the method for manufacturing the semiconductor device of the first embodiment.

Next, a nickel film 24 is formed on the silicon carbide layer 10 in the opening 22 (FIG. 5). The nickel film 24 is an example of the first metal film. The nickel film 24 is formed using, for example, a sputtering method. In order to improve the coverage of the nickel film 24, for example, a metal vapor deposition method, a CVD method, or the like is also effective.

Figure 6:
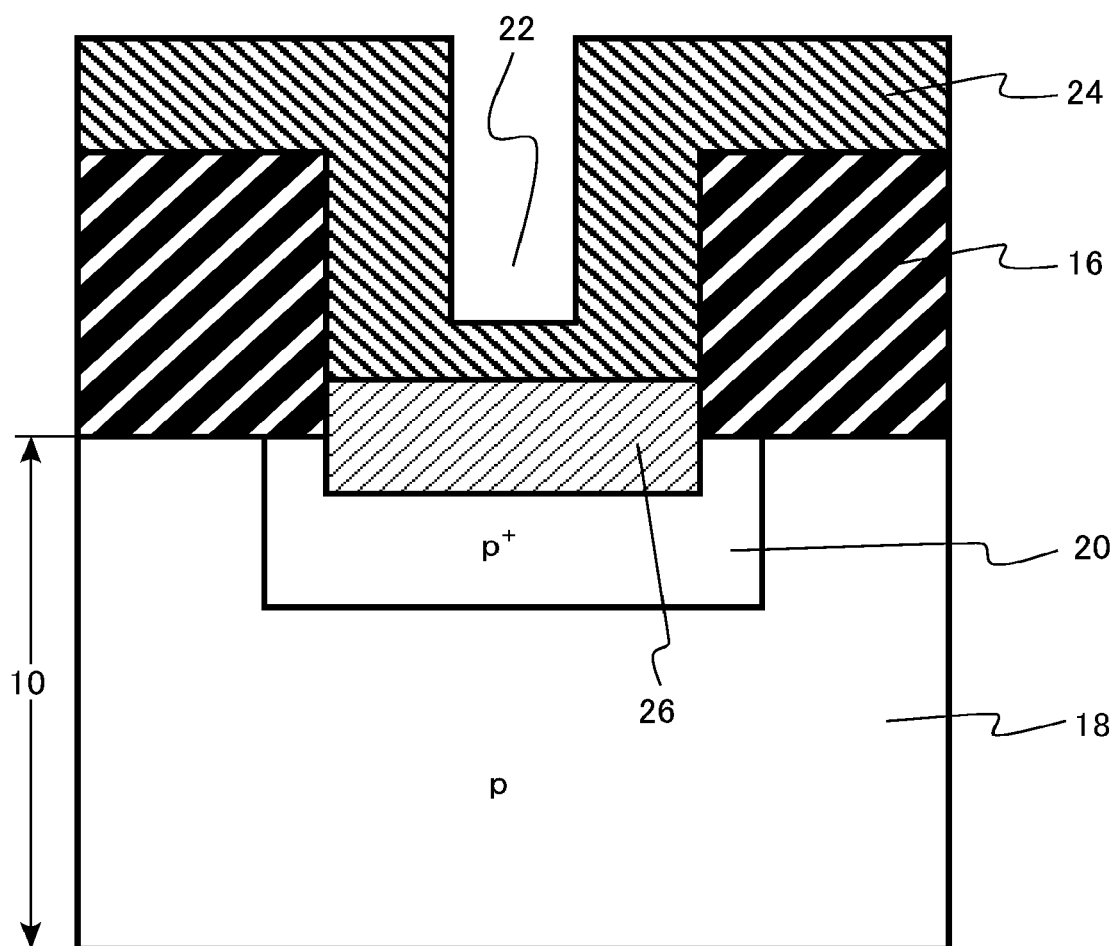
FIG. 6 is a schematic cross-sectional view illustrating the method for manufacturing the semiconductor device of the first embodiment.

Next, heat treatment is performed in an atmosphere containing at least any one of carbon dioxide ($CO_2$) and atomic hydrogen (H). The heat treatment causes the silicon carbide layer 10 to react with the nickel film 24 to form a nickel silicide layer 26 (FIG. 6). The nickel silicide layer 26 is an example of the metal silicide layer 14. This heat treatment is so-called silicidation anneal.

The heat treatment is performed, for example, in an atmosphere containing carbon dioxide. The heat treatment is performed, for example, in an atmosphere containing a carbon dioxide gas. A temperature of the heat treatment is, for example, 500° C. or higher and lower than 900° C.

The atmosphere of the heat treatment may contain a diluent gas. The diluent gas is, for example, a nitrogen gas or an argon gas.

In addition, the heat treatment is performed, for example, in an atmosphere containing atomic hydrogen. The atomic hydrogen is produced by, for example, a heated catalyst method.

In the heated catalyst method, hydrogen molecules are thermally dissociated by a metal filament for thermal dissociation. Atomic elements can be produced by the heated catalyst method. The hydrogen molecules can be dissociated into hydrogen atoms by the heated catalyst method. The metal filament is, for example, tungsten, molybdenum, iron chromium, rhenium, or thorium.

For example, a hydrogen gas is introduced into a heated tungsten filament. Dissociative adsorption of hydrogen molecules occurs on the tungsten filament. Then, atomic hydrogen is thermally desorbed from the tungsten filament. A heating temperature of the tungsten filament is, for example, 1600° C.

A temperature of the heat treatment is, for example, 500° C. or higher and lower than 900° C. The atomic hydrogen generated by the heated catalyst method is introduced into a heat treatment furnace and is subjected to heat treatment using, for example, a carrier gas. The carrier gas is, for example, a nitrogen gas or an argon gas.

During the heat treatment, the silicon carbide layer 10 reacts with the nickel film 24. Therefore, the depth (d1 in FIG. 1) of the interface between the silicon carbide layer 10 and the metal silicide layer 14, when the interface between the silicon carbide layer 10 and the insulating layer 16 is set as the reference, is 50 nm or more.

During the heat treatment, p-type impurities pile up at the interface (interface X in FIG. 2) between the silicon carbide layer 10 and the metal silicide layer 14. Therefore, a p-type impurity concentration at the interface between silicon carbide layer 10 and metal silicide layer 14 becomes higher.

Figure 7:
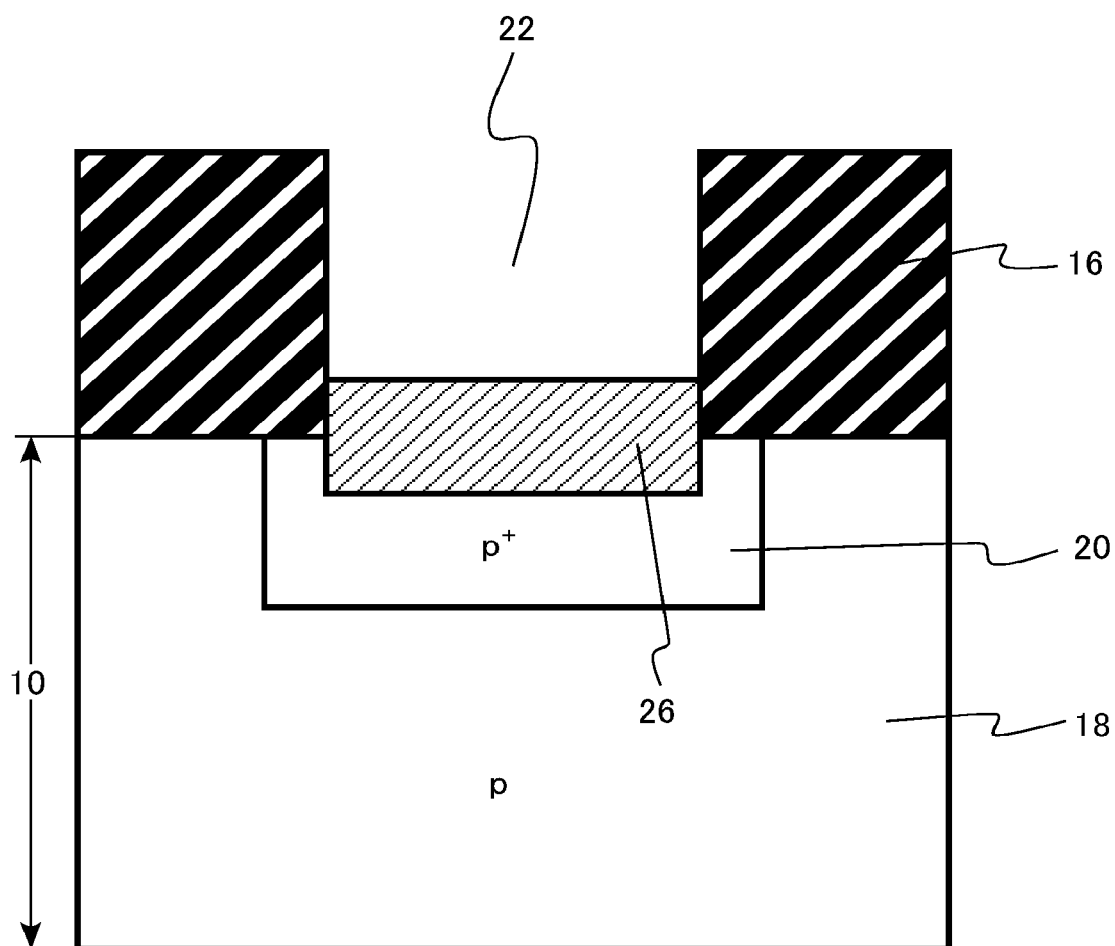
FIG. 7 is a schematic cross-sectional view illustrating the method for manufacturing the semiconductor device of the first embodiment.

Next, the unreacted nickel film 24 is removed (FIG. 7). The nickel film 24 is removed by, for example, wet etching.

Figure 8:
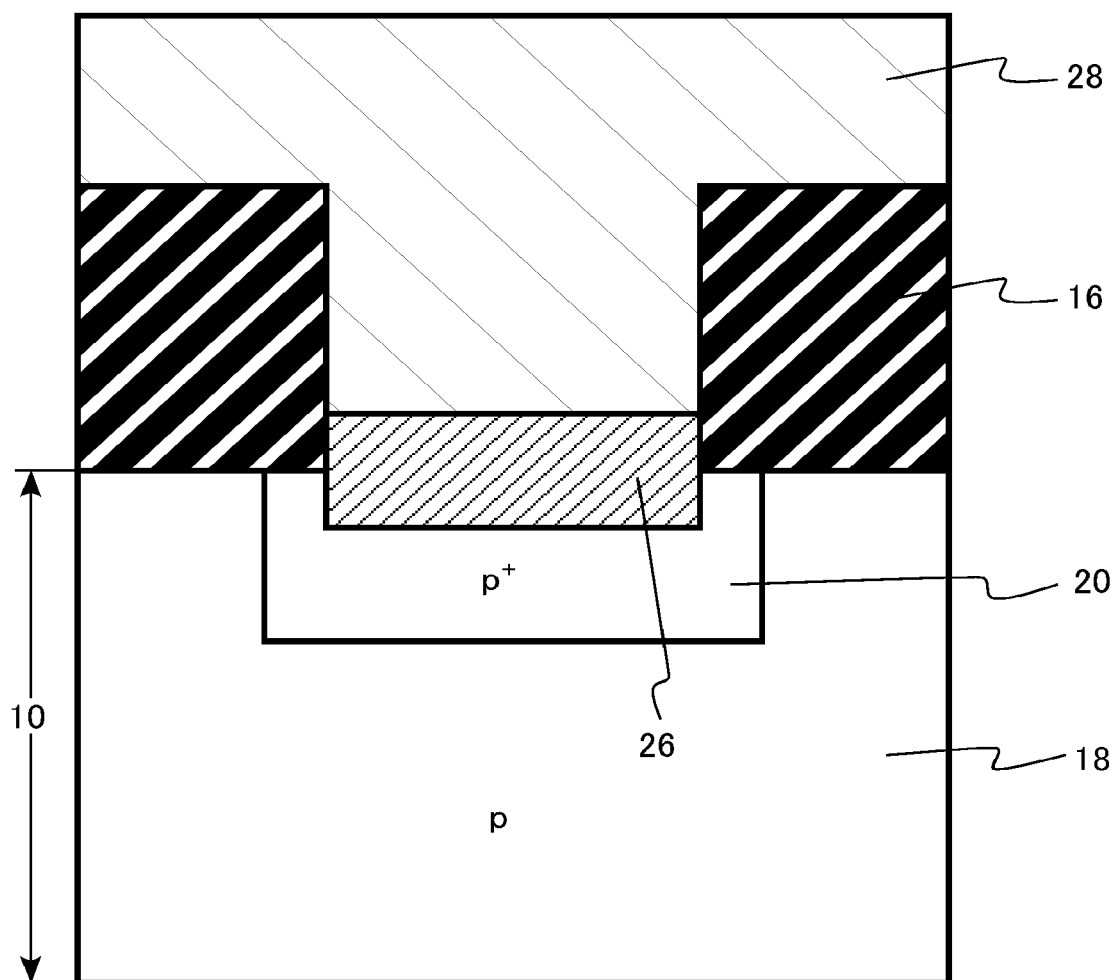
FIG. 8 is a schematic cross-sectional view illustrating the method for manufacturing the semiconductor device of the first embodiment.

Next, the opening 22 is filled with an aluminum film 28 (FIG. 8). The aluminum film 28 is in contact with the nickel silicide layer 26. The aluminum film 28 is an example of the second metal film.

Thereafter, for example, the aluminum film 28 on the insulating layer 16 is removed, whereby the contact structure 100 illustrated in FIG. 1 is manufactured.

Next, a function and an effect of the semiconductor device of the first embodiment and the method for manufacturing the semiconductor device will be described.

In the contact structure 100 of the first embodiment, the carbon concentration in the metal silicide layer 14 is $1\times10^{17}$ $cm^{-3}$ or less. With this configuration, the contact resistance between the silicon carbide layer 10 and the contact electrode 12 decreases. Details will be described hereinafter.

Figure 9:
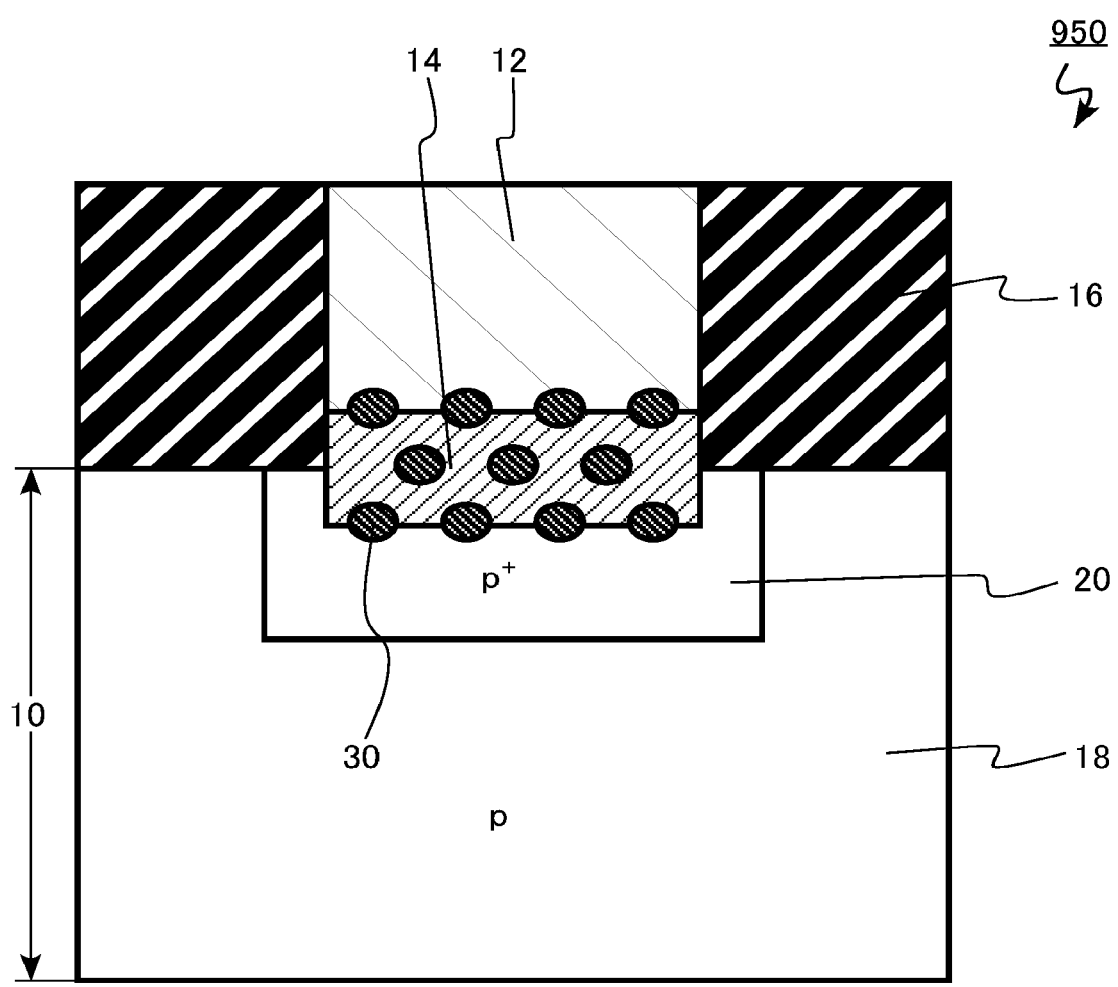
FIG. 9 is a schematic cross-sectional view of a semiconductor device of a comparative example.

FIG. 9 is a schematic cross-sectional view of a semiconductor device of a comparative example. The semiconductor device of the comparative example is a semiconductor device having a contact structure 950.

The contact structure 950 includes the metal silicide layer 14 between the silicon carbide layer 10 and the contact electrode 12. Since the metal silicide layer 14 is provided, the contact resistance between the silicon carbide layer 10 and the contact electrode 12 decreases.

The contact structure 950 has a larger amount of carbon clusters 30 existing at an interface between the silicon carbide layer 10 and the metal silicide layer 14, in the metal silicide layer 14, or at an interface between the metal silicide layer 14 and the contact electrode 12 than the contact structure 100 of the first embodiment. Due to the large amount of carbon clusters 30, the contact structure 950 has a higher carbon concentration in the metal silicide layer 14 than the contact structure 100 of the first embodiment. A carbon concentration in the metal silicide layer 14 of the contact structure 950 is, for example, $1\times10^{18}$ $cm^{-3}$ or more.

A method for manufacturing the contact structure 950 differs from the method for manufacturing the contact structure 100 in that heat treatment for forming the metal silicide layer 14 is performed in, for example, an atmosphere containing nitrogen.

When the heat treatment for forming the metal silicide layer 14 is performed in an atmosphere containing a nitrogen gas, excess carbon in the silicon carbide layer 10 is precipitated as the carbon cluster 30 as illustrated in FIG. 9. The carbon clusters 30 are precipitated at the interface between the silicon carbide layer 10 and the metal silicide layer 14, in the metal silicide layer 14, or at the interface between the metal silicide layer 14 and the contact electrode 12.

The large amount of the carbon clusters 30 increases the contact resistance between the silicon carbide layer 10 and the contact electrode 12. Further, there is a possibility that the large amount of the carbon clusters 30 causes separation between the silicon carbide layer 10 and the metal silicide layer 14, or between the metal silicide layer 14 and the contact electrode 12.

Figure 10:
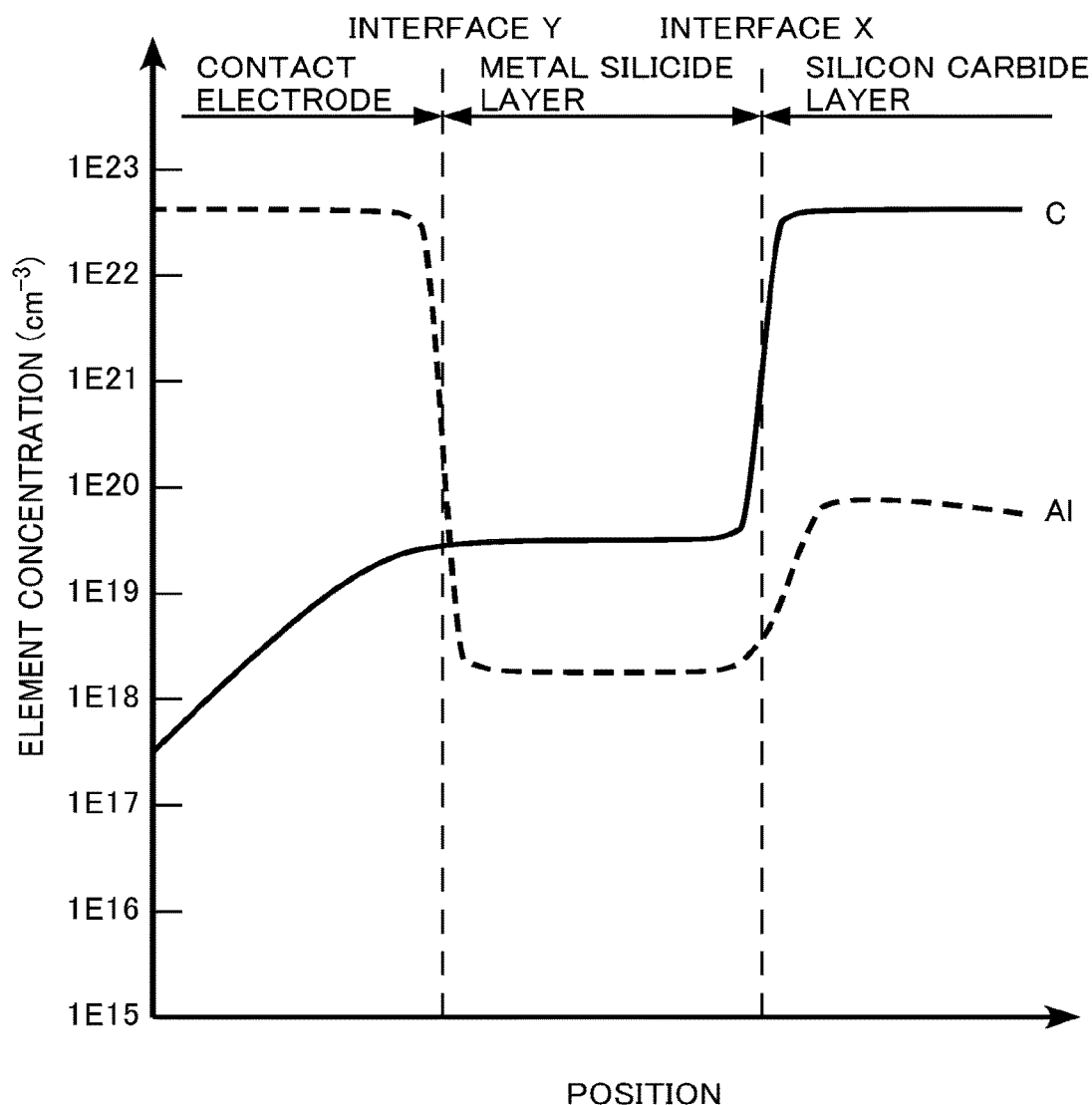
FIG. 10 is a graph illustrating element concentration distributions of the semiconductor device of the comparative example.

FIG. 10 is a graph illustrating element concentration distributions of the semiconductor device of the comparative example. FIG. 10 is a graph illustrating the element concentration distributions in the contact electrode 12, the metal silicide layer 14, and the silicon carbide layer 10. FIG. 10 is a graph illustrating the element distribution of the contact structure 950 in a direction normal to a front surface of the silicon carbide layer 10. FIG. 10 illustrates a case where the p-type impurity contained in the silicon carbide layer is aluminum (Al) and the contact electrode 12 contains aluminum.

The carbon concentration of the metal silicide layer 14 is $1\times10^{18}$ $cm^{-3}$ or more. The carbon concentration of the metal silicide layer 14 may be $1\times10^{19}$ $cm^{-3}$ or more.

The carbon concentration of the contact electrode 12 is $1\times10^{17}$ $cm^{-3}$ or more. The carbon concentration of the contact electrode 12 may be $1\times10^{18}$ $cm^{-3}$ or more.

It is considered that the carbon concentration of the contact electrode 12 increases as carbons in the metal silicide layer 14 diffuse into the contact electrode 12.

A concentration distribution of aluminum in the silicon carbide layer 10 and the metal silicide layer 14 decreases from the silicon carbide layer 10 toward the interface (interface X in FIG. 10) between the silicon carbide layer 10 and the metal silicide layer 14. The aluminum concentration at the interface X is, for example, less than $1\times10^{19}$ cm$^{-3}$. The aluminum concentration at the interface X is lower than the aluminum concentration in the silicon carbide layer 10.

The aluminum concentration of the metal silicide layer 14 is $1\times10^{17}$ cm$^{-3}$ or more. The aluminum concentration of the metal silicide layer 14 is $1\times10^{18}$ cm$^{-3}$ or more.

When the heat treatment for forming the metal silicide layer 14 is performed in an atmosphere containing a nitrogen gas, excessive carbons bond with aluminum to stably form a carbon-aluminum composite (Al—C pair) in the metal silicide layer 14. Therefore, it is considered that aluminum in the silicon carbide layer 10 is sucked out to the metal silicide layer 14 and the aluminum concentration in the metal silicide layer 14 increases. Further, it is considered that the aluminum concentration in the silicon carbide layer 10 decreases at the interface as aluminum is sucked out to the metal silicide layer 14.

The contact structure 100 of the first embodiment has a smaller amount of carbon clusters 30 existing at the interface between the silicon carbide layer 10 and the metal silicide layer 14, in the metal silicide layer 14, or at the interface between the metal silicide layer 14 and the contact electrode 12 than the contact structure 950 of the comparative example. In the contact structure 100, for example, the carbon cluster 30 does not exist. Due to the small amount of the carbon cluster 30, the contact structure 100 has a lower carbon concentration in the metal silicide layer 14 than the contact structure 950 of the comparative example. A carbon concentration in the metal silicide layer 14 of the contact structure 100 is, for example, $1\times10^{17}$ cm$^{-3}$ or less.

Since the contact structure 100 has the small amount of the carbon cluster 30, the contact resistance between the silicon carbide layer 10 and the contact electrode 12 decreases. Since the amount of the carbon cluster 30 is small in the contact structure 100, the possibility of the separation between the silicon carbide layer 10 and the metal silicide layer 14 or between the metal silicide layer 14 and the contact electrode 12 is reduced.

The contact structure 100 of the first embodiment can be implemented by performing the heat treatment for forming the metal silicide layer 14 in an atmosphere containing at least any one of carbon dioxide and atomic hydrogen. Since the heat treatment is performed in the atmosphere containing at least any one of carbon dioxide and atomic hydrogen, the amount of the carbon cluster 30 of the contact structure 100 can be reduced.

First, a case where the heat treatment for forming the metal silicide layer 14 is performed in an atmosphere containing carbon dioxide is considered. As a result of first principle calculation performed by the inventor, it has been found that the following Formula (1) is established.

$$C+CO_2=2CO+2.84 \text{ eV} \quad \text{Formula (1)}$$

From Formula (1), when excess carbon (C) and carbon dioxide ($CO_2$) coexist during the heat treatment for forming the metal silicide layer 14, it can be understood that it is more stable that the reaction occurs to form carbon monoxide (CO). Therefore, since the heat treatment for forming the metal silicide layer 14 is performed in the atmosphere containing carbon dioxide, excess carbon becomes carbon monoxide and diffuses outward, and does not form the carbon cluster 30. Accordingly, the amount of the carbon cluster 30 of the contact structure 100 is reduced.

Next, a case where the heat treatment for forming the metal silicide layer 14 is performed in an atmosphere containing atomic hydrogen is considered. As a result of first principle calculation performed by the inventor, it has been found that the following Formula (2) is established.

$$C+4H=CH_4+14.52 \text{ eV} \quad \text{Formula (2)}$$

From Formula (2), when excess carbon (C) and atomic hydrogen (H) coexist during the heat treatment for forming the metal silicide layer 14, it can be understood that it is more stable that the reaction occurs to form methane ($CH_4$). Therefore, since the heat treatment for forming the metal silicide layer 14 is performed in the atmosphere containing atomic hydrogen, excess carbon becomes methane and diffuses outward, and does not form the carbon cluster 30. Accordingly, the amount of the carbon cluster 30 of the contact structure 100 is reduced.

As a result of first principle calculation performed by the inventor, it has been found that the following Formula (3) is established.

$$C+2H_2=CH_4-4.48 \text{ eV} \quad \text{Formula (3)}$$

From Formula (3), when the heat treatment for forming the metal silicide layer 14 is performed in the atmosphere containing a hydrogen gas, that is, molecular hydrogen ($H_2$), it can be understood that coexistence of excess carbon (C) and molecular hydrogen ($H_2$) is more stable than formation of methane ($CH_4$). Therefore, the excess carbon remains, and the carbon cluster 30 is formed.

When the heat treatment for forming the metal silicide layer 14 is performed in the atmosphere containing nitrogen as in the comparative example, the reaction between excess carbon (C) and nitrogen does not occur. Therefore, the excess carbon remains, and the carbon cluster 30 is formed.

In the contact structure 100 of the first embodiment, the carbon concentration of the metal silicide layer 14 is preferably $1\times10^{17}$ cm$^{-3}$ or less, and more preferably $1\times10^{16}$ cm$^{-3}$ or less. When the carbon concentration satisfies the above range, the amount of the carbon cluster 30 is further reduced and the contact resistance decreases.

In the contact structure 100 of the first embodiment, the carbon concentration of the contact electrode 12 is lower than that of the contact structure 950. If the carbon concentration of the contact electrode 12 is high, there is a possibility that the resistivity of the contact electrode 12 increases or the reliability decreases, which is not preferable. The contact structure 100 suppresses the increase in resistivity of the contact electrode 12 and the decrease in reliability as compared with the contact structure 950.

In the contact structure 100 of the first embodiment, the atomic ratio of the metal element to silicon (Si) in the metal silicide layer 14 (M/Si) is preferably 1.2 or more, more preferably 1.5 or more, and even more preferably 1.8 or more. The higher the atomic ratio (M/Si) is, the lower the resistivity of the metal silicide is. Therefore, when the atomic ratio (M/Si) satisfies the above range, the resistivity of the metal silicide is lowered, and the contact resistance decreases.

The atomic ratio (M/Si) decreases as the temperature of the heat treatment for forming the metal silicide layer 14 increases. Therefore, the temperature of the heat treatment for forming the metal silicide layer 14 is preferably lower than 900° C., more preferably 850° C. or lower, even more preferably 800° C. or lower, and most preferably 750° C. or lower. Therefore, when the temperature of the heat treatment satisfies the above range, the resistivity of the metal silicide is lowered, and the contact resistance decreases.

In addition, when the temperature of the heat treatment for forming the metal silicide layer 14 is set to a low temperature, the outward diffusion of excess carbon is likely to proceed. From this viewpoint, the temperature of the heat treatment for forming the metal silicide layer 14 is preferably lower than 900° C., more preferably 850° C. or lower, even more preferably 800° C. or lower, and most preferably 750° C. or lower.

Meanwhile, from the viewpoint of sufficiently performing the silicide reaction, the temperature of the heat treatment for forming the metal silicide layer 14 is preferably 500° C. or higher, more preferably 550° C. or higher, and even more preferably 600° C. or higher.

For example, a case where the metal element is nickel (Ni) and the metal silicide layer 14 is a nickel silicide is considered. Nickel has silicide phases of $Ni_{31}Si_{12}$, $Ni_2Si$, $NiSi$, and $NiSi_2$. Atomic ratios of nickel to silicon (Si) (Ni/Si) in the respective silicide phases are 2.6, 2.0, 1.0, and 0.5.

The resistivity of each silicide layer satisfies the following inequality.

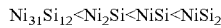

$Ni_{31}Si_{12} < Ni_2Si < NiSi < NiSi_2$

It is preferable that the proportion of $Ni_2Si$ contained in the metal silicide layer 14 be higher than that of NiSi contained in the metal silicide layer 14 from the viewpoint of reducing the contact resistance. In addition, it is preferable that the proportion of $Ni_2Si$ be the highest in the nickel silicide contained in the metal silicide layer 14.

A stable temperature range for $Ni_{31}Si_{12}$ is lower than 550° C., a stable temperature range for $Ni_2Si$ is 550° C. or higher and 800° C. or lower, a stable temperature range for NiSi is 800° C. or higher and 1000° C. or lower, and a stable temperature range for $NiSi_2$ is 1000° C. or higher.

From the viewpoint of increasing the proportion of $Ni_2Si$ contained in the metal silicide layer 14, the temperature of the heat treatment for forming the metal silicide layer 14 is preferably 800° C. or lower, more preferably 750° C. or lower, and even more preferably 700° C. or lower.

In the contact structure 100 of the first embodiment, the concentration distribution of aluminum in the silicon carbide layer 10 and the metal silicide layer 14 has the peak at the interface (interface X in FIG. 2) between the silicon carbide layer 10 and the metal silicide layer 14. Therefore, a Schottky barrier between the silicon carbide layer 10 and the metal silicide layer 14 is lowered, a tunnel current is likely to flow, and the resistance decreases. Accordingly, the contact resistance between the silicon carbide layer 10 and the contact electrode 12 decreases.

When manufacturing the contact structure 100 of the first embodiment, the excess carbon generated during the heat treatment for forming the metal silicide layer 14 decreases. Therefore, the amount of the carbon-aluminum composite (Al—C pair) formed in the metal silicide layer 14 also decreases. Therefore, it is possible to prevent aluminum in the silicon carbide layer 10 from being sucked out to the metal silicide layer 14. Therefore, the aluminum concentration in the metal silicide layer 14 is considered to be lower than that in the contact structure 950. In addition, the aluminum concentration at the interface (interface X in FIG. 2) between the silicon carbide layer 10 and the metal silicide layer 14 in the contact structure 100 is considered to be higher than that in the contact structure 950.

The contact structure 100 of the first embodiment limits the metal element forming the metal silicide layer 14 to nickel (Ni), palladium (Pd), or platinum (Pt). The nickel (Ni), palladium (Pd), and platinum (Pt) hardly react with carbon and hardly form metal carbides. In general, the resistivity of a metal carbide is higher than that of a metal silicide.

The contact structure 100 of the first embodiment suppresses the formation of the metal carbide by limiting the metal element. Therefore, it is possible to suppress an increase in contact resistance between the silicon carbide layer 10 and the contact electrode 12 caused by the formation of the metal carbide.

As described above, the semiconductor device that decreases the contact resistance between the silicon carbide layer and the metal electrode is provided according to the first embodiment.

Second Embodiment

A semiconductor device of a second embodiment differs from the semiconductor device of the first embodiment in that an impurity contained in a silicon carbide layer is an n-type impurity. Hereinafter, some of the content overlapping with that in the first embodiment will not be described.

Figure 11:
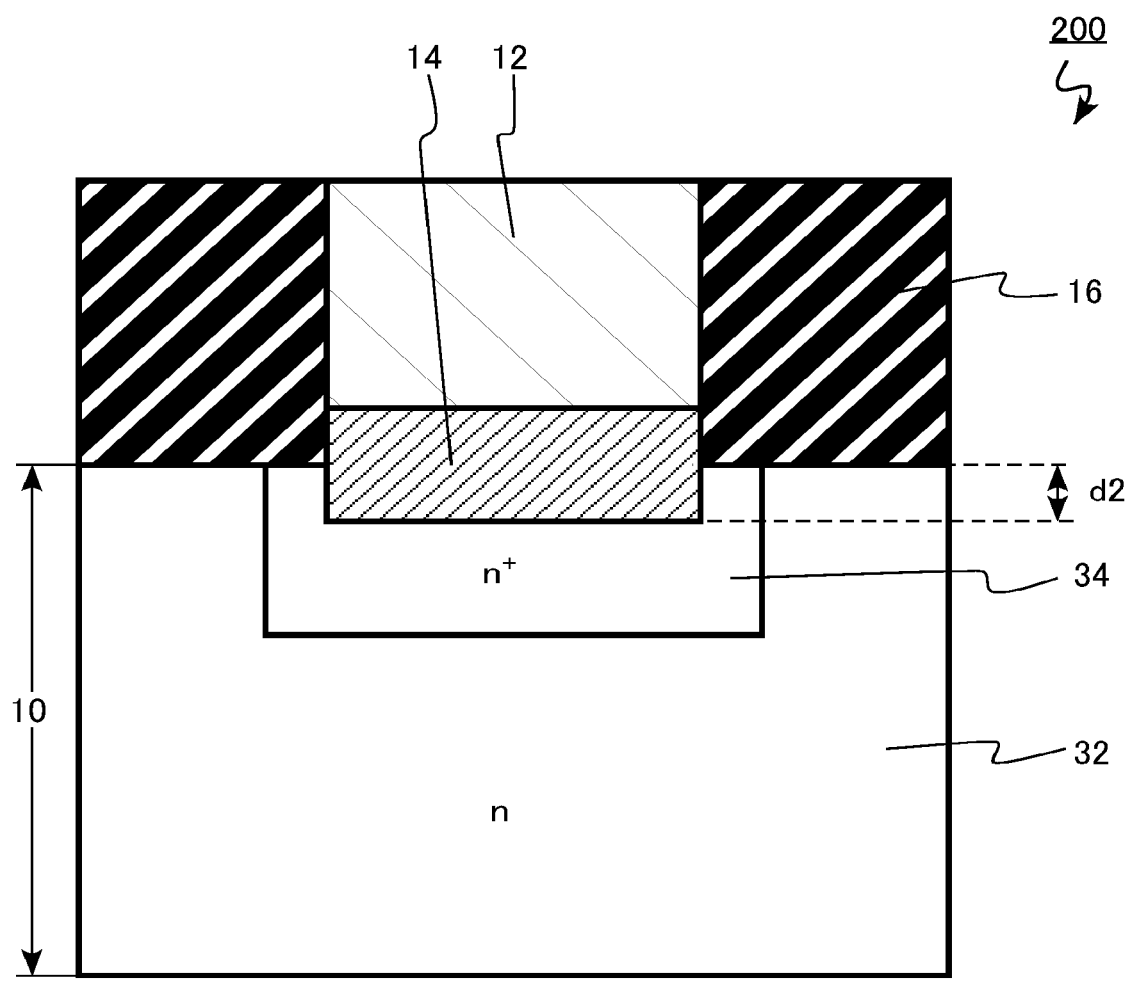
FIG. 11 is a schematic cross-sectional view of a semiconductor device of a second embodiment.

FIG. 11 is a schematic cross-sectional view of the semiconductor device of the second embodiment. The semiconductor device of the second embodiment is a semiconductor device including a contact structure 200.

The contact structure 200 includes the silicon carbide layer 10, the contact electrode 12 (metal layer), the metal silicide layer 14 (conductive layer), and the insulating layer 16.

The silicon carbide layer 10 has a low-concentration n-type region 32 and a high-concentration n-type region 34.

The silicon carbide layer 10 is a single crystal of, for example, a 4H—SiC. The silicon carbide layer 10 contains an impurity. The silicon carbide layer 10 contains an n-type impurity.

The low-concentration n-type region 32 of the silicon carbide layer 10 contains an n-type impurity. The low-concentration n-type region 32 contains, for example, phosphorus (P) or nitrogen (N) as the n-type impurity. An n-type impurity concentration of the low-concentration n-type region 32 is, for example, $1 \times 10^{16}$ cm$^{-3}$ or more and $1 \times 10^{18}$ cm$^{-3}$ or less.

The high-concentration n-type region 34 of the silicon carbide layer 10 contains an n-type impurity. The high-concentration n-type region 34 contains, for example, phosphorus (P) or nitrogen (N) as the n-type impurity. An n-type impurity concentration of the high-concentration n-type region 34 is higher than the n-type impurity concentration of the low-concentration n-type region 32. The n-type impurity concentration of the high-concentration n-type region 34 is, for example, $1 \times 10^{19}$ cm$^{-3}$ or more and $1 \times 10^{22}$ cm$^{-3}$ or less.

The contact electrode 12 is positioned on a front surface side of the silicon carbide layer 10. The contact electrode 12 is an example of a metal layer.

The contact electrode 12 contains metal. The contact electrode 12 is, for example, aluminum, an aluminum alloy, tungsten, or copper.

The contact electrode 12 may include, for example, a barrier metal film (not illustrated) between the contact electrode 12 and the metal silicide layer 14. The barrier metal film is, for example, titanium or titanium nitride.

A carbon concentration of the contact electrode 12 is, for example, $1 \times 10^{17}$ cm$^{-3}$ or less.

The metal silicide layer 14 is provided between the silicon carbide layer 10 and the contact electrode 12. The metal silicide layer 14 is an example of a conductive layer. The metal silicide layer 14 is in contact with the silicon carbide layer 10. The metal silicide layer 14 is in contact with the contact electrode 12.

The metal silicide layer 14 contains a silicide of one metal element (M) selected from the group consisting of nickel (Ni), palladium (Pd), and platinum (Pt). The metal silicide layer 14 contains a nickel silicide, a palladium silicide, or a platinum silicide. The metal silicide layer 14 is, for example, a nickel silicide, a palladium silicide, or a platinum silicide.

A carbon concentration of the metal silicide layer 14 is $1\times10^{17}$ cm$^{-3}$ or less.

An atomic ratio (M/Si) of the metal element to silicon (Si) in the metal silicide layer 14 is 1.2 or more, for example. For example, it is assumed that the metal silicide layer 14 is a nickel silicide. Nickel has silicide phases represented by composition formulas of $Ni_{31}Si_{12}$, $Ni_2Si$, $NiSi$, and $NiSi_2$. Atomic ratios (Ni/Si) of nickel to silicon (Si) of $Ni_{31}Si_{12}$, $Ni_2Si$, $NiSi$, and $NiSi_2$ are 2.6, 2.0, 1.0, and 0.5, respectively.

An n-type impurity concentration of the metal silicide layer 14 is, for example, $1\times10^{17}$ cm$^{-3}$ or less. A phosphorus concentration of the metal silicide layer 14 is, for example, $1\times10^{17}$ cm$^{-3}$ or less. A nitrogen concentration of the metal silicide layer 14 is, for example, $1\times10^{17}$ cm$^{-3}$ or less.

A thickness of the metal silicide layer 14 in a direction normal to the front surface of the silicon carbide layer 10 is, for example, 50 nm or more and 500 nm or less.

The insulating layer 16 is positioned on the front surface side of the silicon carbide layer 10. The insulating layer 16 is provided on the side of the silicon carbide layer 10 where the contact electrode 12 is positioned. The insulating layer 16 is in contact with the silicon carbide layer 10.

The insulating layer 16 is, for example, silicon oxide.

The contact electrode 12 is formed inside an opening formed in the insulating layer 16, for example.

A depth (d2 in FIG. 11) of an interface between the silicon carbide layer 10 and the metal silicide layer 14 is, for example, 50 nm or more and 500 nm or less. In the second embodiment, the "depth" is a depth when an interface between the silicon carbide layer 10 and the insulating layer 16 is set as a reference.

Figure 12:
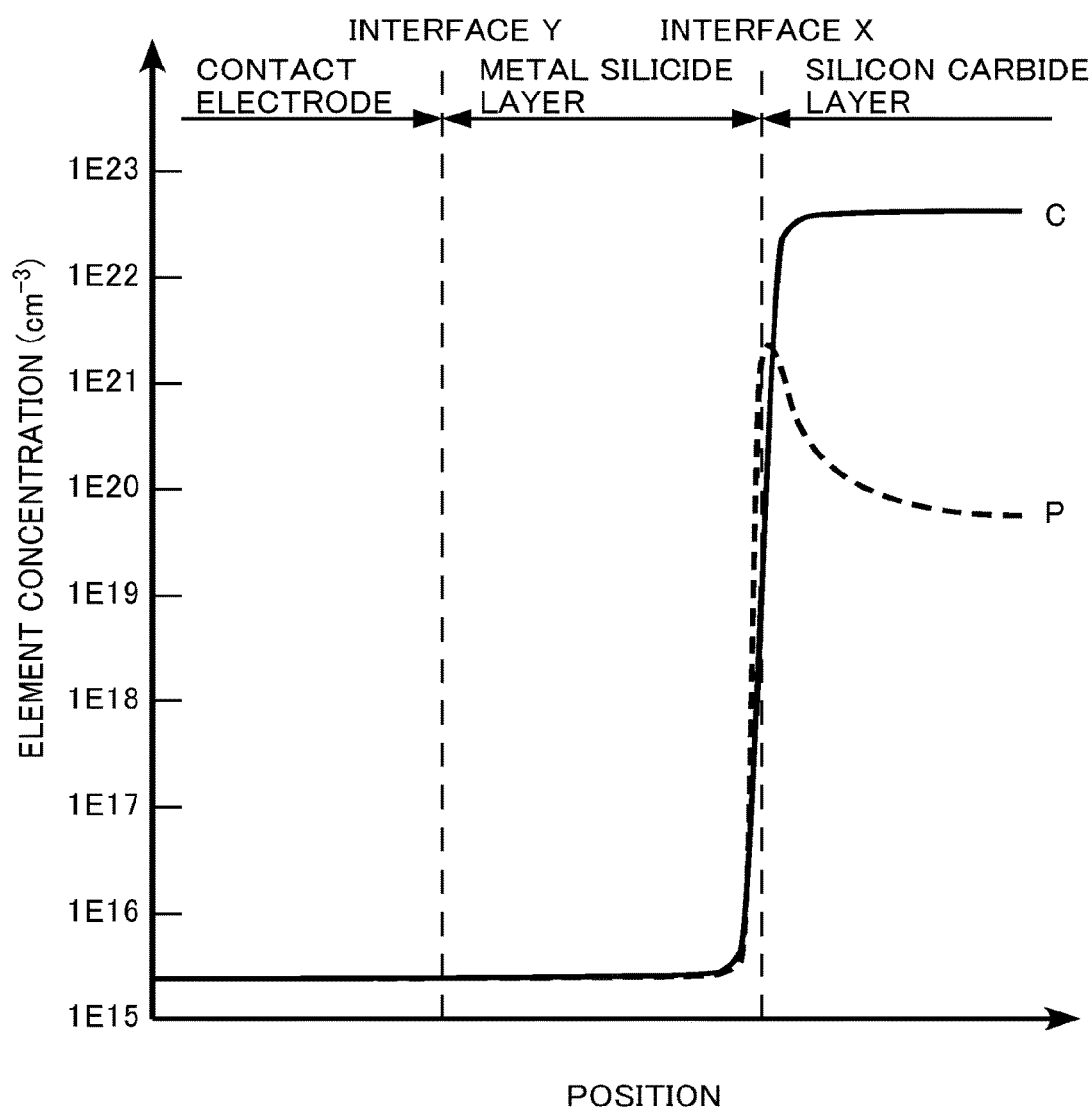
FIG. 12 is a graph illustrating element concentration distributions of the semiconductor device of the second embodiment.

FIG. 12 is a graph illustrating element concentration distributions of the semiconductor device of the second embodiment. FIG. 12 is a graph illustrating the element concentration distributions in the contact electrode 12, the metal silicide layer 14, and the silicon carbide layer 10. FIG. 12 is a graph illustrating the element distribution of the contact structure 200 in a direction normal to a front surface of the silicon carbide layer 10. FIG. 12 illustrates a case where the n-type impurity contained in the silicon carbide layer is phosphorus (P) and the contact electrode 12 contains aluminum.

A carbon concentration of the metal silicide layer 14 is $1\times10^{17}$ cm$^{-3}$ or less. The carbon concentration of the metal silicide layer 14 is $1\times10^{16}$ cm$^{-3}$ or less.

For example, the carbon concentration of the metal silicide layer 14 is represented by a carbon concentration of a region separated by a predetermined distance or more from an interface (interface X in FIG. 12) between the silicon carbide layer 10 and the metal silicide layer 14 and an interface (interface Y in FIG. 12) between the contact electrode 12 and the metal silicide layer 14. The predetermined distance is, for example, 10 nm. The carbon concentration of the metal silicide layer 14 is represented by, for example, a carbon concentration of a central portion of the metal silicide layer 14.

The carbon concentration of the contact electrode 12 is $1\times10^{17}$ cm$^{-3}$ or less. A carbon concentration of the contact electrode 12 is $1\times10^{16}$ cm$^{-3}$ or less.

The carbon concentration of the contact electrode 12 is represented by, for example, a carbon concentration of a region separated by a predetermined distance or more from the interface (interface Y in FIG. 12) between the contact electrode 12 and the metal silicide layer 14. The predetermined distance is, for example, 10 nm.

A concentration distribution of phosphorus in the silicon carbide layer 10 and the metal silicide layer 14 has a peak at the interface (interface X in FIG. 12) between the silicon carbide layer 10 and the metal silicide layer 14. A phosphorus concentration at the peak of the phosphorus concentration distribution is, for example, $1\times10^{20}$ cm$^{-3}$ or more and $1\times10^{22}$ cm$^{-3}$ or less.

The phosphorus concentration of the metal silicide layer 14 is $1\times10^{17}$ cm$^{-3}$ or less. The phosphorus concentration of the metal silicide layer 14 is $1\times10^{16}$ cm$^{-3}$ or less.

For example, the phosphorus concentration of the metal silicide layer 14 is represented by a phosphorus concentration of a region separated by a predetermined distance or more from an interface (interface X in FIG. 12) between the silicon carbide layer 10 and the metal silicide layer 14 and an interface (interface Y in FIG. 12) between the contact electrode 12 and the metal silicide layer 14. The predetermined distance is, for example, 10 nm. The phosphorus concentration of the metal silicide layer 14 is represented by, for example, a phosphorus concentration of a central portion of the metal silicide layer 14.

Next, a method for manufacturing the semiconductor device of the second embodiment is the same as the method for manufacturing the semiconductor device of the first embodiment, except that the impurity of the silicon carbide layer 10 to be prepared is the n-type impurity.

As described above, the semiconductor device that decreases the contact resistance between the silicon carbide layer and the metal electrode with the same function as that of the first embodiment is provided according to the second embodiment.

Third Embodiment

A semiconductor device of a third embodiment includes: a silicon carbide layer having a first plane and a second plane facing the first plane and including a first silicon carbide region of n-type, a second silicon carbide region of p-type positioned between the first silicon carbide region and the first plane, a third silicon carbide region of n-type positioned between the second silicon carbide region and the first plane and having a higher n-type impurity concentration than the first silicon carbide region, and a fourth silicon carbide region of p-type positioned between the first silicon carbide region and the first plane and having a higher p-type impurity concentration than the second silicon carbide region; a gate electrode positioned on a side of the first plane of the silicon carbide layer; a gate insulating layer positioned between the gate electrode and the second silicon carbide region; a first electrode positioned on the side of the first plane of the silicon carbide layer and electrically connected to the third silicon carbide region and the fourth silicon carbide region; a second electrode positioned on a side of the second plane of the silicon carbide layer and electrically connected to the first silicon carbide region; and a conductive layer positioned between the silicon carbide layer and the first electrode, the conductive layer being in contact with the third silicon carbide region and the fourth silicon carbide region, the conductive layer containing a silicide of one metal element (M) selected from a group consisting of nickel (Ni), palladium (Pd), and platinum (Pt), and the conductive layer having a carbon concentration of $1\times10^{17}$ cm$^{-3}$ or less.

The semiconductor device of the third embodiment uses the contact structures of the first and second embodiments as a contact structure between the silicon carbide layer and the first electrode. Hereinafter, some of the content overlapping with that in the first or second embodiment will not be described.

Figure 13:
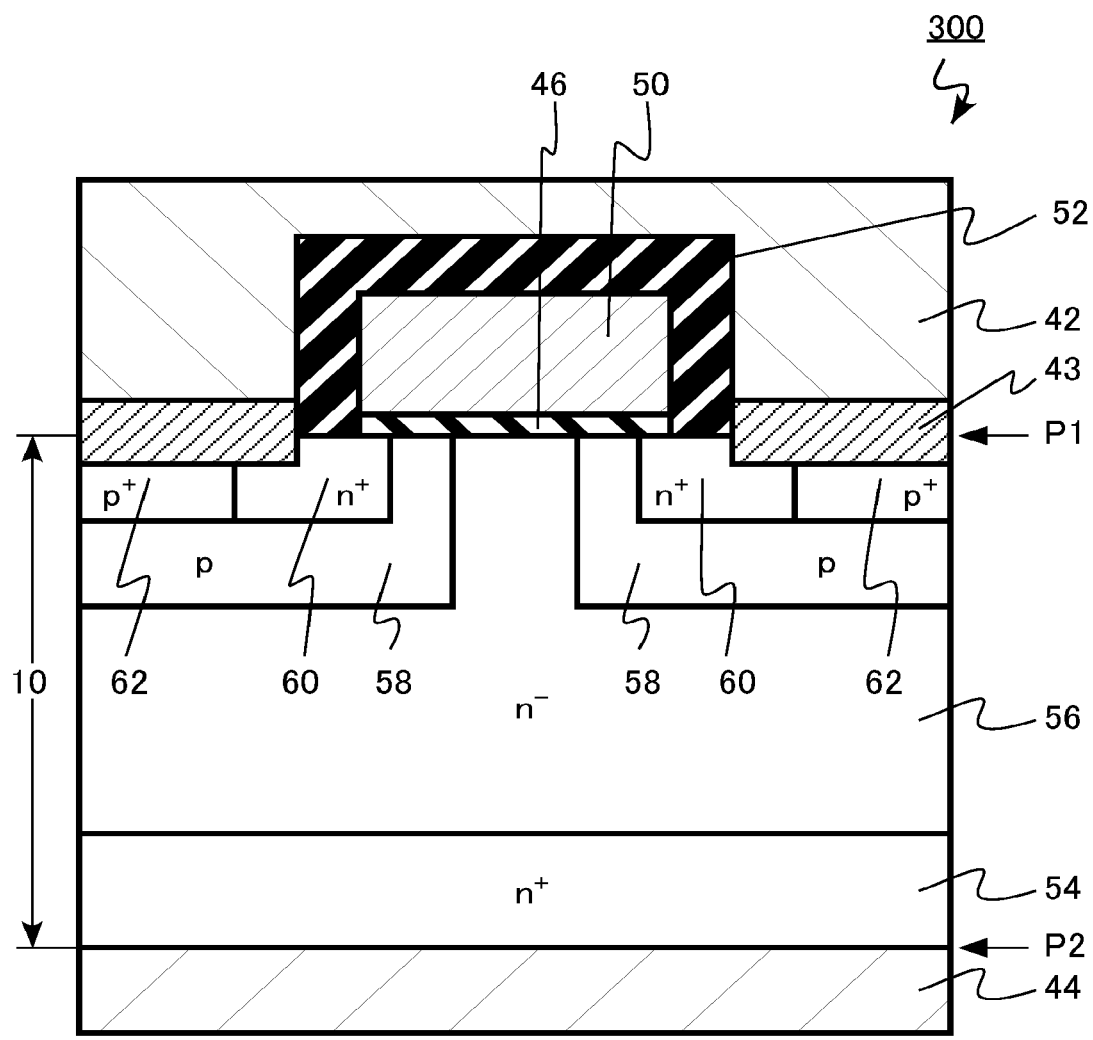
FIG. 13 is a schematic cross-sectional view of a semiconductor device of a third embodiment.

FIG. 13 is a schematic cross-sectional view of the semiconductor device of the third embodiment. The semiconductor device of the third embodiment is a vertical MOSFET 300. The MOSFET 300 is an n-channel transistor that uses electrons as carriers.

The MOSFET 300 includes the silicon carbide layer 10, a source electrode 42 (first electrode and metal layer), a metal silicide layer 43 (conductive layer), a drain electrode 44 (second electrode), a gate insulating layer 46, a gate electrode 50, and an interlayer insulating layer 52 (insulating layer).

The source electrode 42 is an example of the first electrode and the metal layer. The metal silicide layer 43 is an example of the conductive layer. The interlayer insulating layer 52 is an example of the insulating layer.

The silicon carbide layer 10 includes a drain region 54, a drift region 56 (first silicon carbide region), a p-well region 58 (second silicon carbide region), a source region 60 (third silicon carbide region), and a p-well contact region 62 (fourth silicon carbide region).

The silicon carbide layer 10 is a single crystal of, for example, a 4H—SiC. The silicon carbide layer 10 has a first plane P1 and a second plane P2. The second plane P2 faces the first plane P1. The first plane P1 is a front surface of the silicon carbide layer 10, and the second plane P2 is a back surface of the silicon carbide layer 10.

In the third embodiment, a "depth" means a depth when the first plane P1 is set as a reference. Here, the first plane P1 is a virtual plane including an interface between the silicon carbide layer 10 and the gate insulating layer 46.

Hereinafter, a description will be given by exemplifying a case where the first plane P1 of the silicon carbide layer 10 is a plane inclined by 0° or more and 10° or less with respect to the silicon face, and the second plane P2 is a plane inclined by 0° or more and 10° or less with respect to the carbon face. The first plane P1 of the silicon carbide layer 10 has an off-angle of 0° or more and 10° or less with respect to the silicon face.

The drain region 54 is n$^+$-type SiC. The drain region 54 contains, for example, nitrogen (N) as an n-type impurity. An n-type impurity concentration of the drain region 54 is, for example, $1 \times 10^{18}$ cm$^{-3}$ or more and $1 \times 10^{21}$ cm$^{-3}$ or less.

The drift region 56 is n$^-$-type SiC. The drift region 56 is positioned between the drain region 54 and the first plane P1. A part of the drift region 56 is in contact with the first plane P1.

The drift region 56 contains, for example, nitrogen (N) as an n-type impurity. An n-type impurity concentration of the drift region 56 is, for example, $1 \times 10^{15}$ cm$^{-3}$ or more and $2 \times 10^{16}$ cm$^{-3}$ or less. The n-type impurity concentration of the drift region 56 is lower than the n-type impurity concentration of the drain region 54.

The drift region 56 is, for example, an SiC epitaxial growth layer formed on the drain region 54 by epitaxial growth. A thickness of the drift region 56 is, for example, 5 μm or more and 100 μm or less.

The p-well region 58 is p-type SiC. The p-well region 58 is positioned between the drift region 56 and the first plane P1. A part of the p-well region 58 is in contact with the first plane P1.

The p-well region 58 contains, for example, aluminum (Al) as a p-type impurity. A p-type impurity concentration of the p-well region 58 is, for example, $1 \times 10^{16}$ cm$^{-3}$ or more and $1 \times 10^{20}$ cm$^{-3}$ or less.

A depth of the p-well region 58 is, for example, 0.4 μm or more and 0.8 μm or less. The p-well region 58 functions as a channel region of the MOSFET 300.

The source region 60 is n$^+$-type SiC. The source region 60 is positioned between the p-well region 58 and the first plane P1. A part of the source region 60 is in contact with the first plane P1. The source region 60 extends in a first direction.

The source region 60 contains phosphorus (P) or nitrogen (N) as an n-type impurity. An n-type impurity concentration of the source region 60 is, for example, $1 \times 10^{18}$ cm$^{-3}$ or more and $1 \times 10^{22}$ cm$^{-3}$ or less. The n-type impurity concentration of the source region 60 is higher than the n-type impurity concentration of the drift region 56.

A depth of the source region 60 is shallower than the depth of the p-well region 58. The depth of the source region 60 is, for example, 0.1 μm or more and 0.4 μm or less.

The p-well contact region 62 is p$^+$-type SiC. The p-well contact region 62 is positioned between the p-well region 58 and the first plane P1. The p-well contact region 62 is adjacent to the source region 60.

The p-well contact region 62 contains, for example, aluminum as a p-type impurity. A p-type impurity concentration of the p-well contact region 62 is, for example, $1 \times 10^{18}$ cm$^{-3}$ or more and $1 \times 10^{22}$ cm$^{-3}$ or less. The p-type impurity concentration of the p-well contact region 62 is higher than the p-type impurity concentration of the p-well region 58.

A depth of the p-well contact region 62 is shallower than the depth of the p-well region 58. The depth of the p-well contact region 62 is, for example, 0.1 μm or more and 0.4 μm or less. Note that the depth of the p-well contact region 62 can also be made deeper than the depth of the p-well region 58.

The gate insulating layer 46 is positioned between the silicon carbide layer 10 and the gate electrode 50. The gate insulating layer 46 is positioned between the p-well region 58 and the gate electrode 50.

The gate insulating layer 46 is, for example, an oxide or an oxynitride. The gate insulating layer 46 is, for example, silicon oxide. A thickness of the gate insulating layer 46 is, for example, 30 nm or more and 100 nm or less.

The gate insulating layer 46 and the p-well region 58 are in contact with each other. The p-well region 58 near the gate insulating layer 46 serves as the channel region of the MOSFET 300.

The gate electrode 50 is positioned on the first plane P1 side of the silicon carbide layer 10. The gate electrode 50 is provided on the gate insulating layer 46. The gate electrode 50 sandwiches the gate insulating layer 46 with the drift region 56, the source region 60, and the p-well region 58.

The gate electrode 50 is a conductor. The gate electrode 50 is, for example, polycrystalline silicon containing an n-type impurity or a p-type impurity. The gate electrode 50 may be metal, for example, titanium nitride, tungsten nitride, tungsten, aluminum, copper, ruthenium, cobalt, nickel, a cobalt silicide, a nickel silicide, or the like. The gate electrode 50 may have a stacked structure including any one kind of the above-described metal and polycrystalline silicon containing an n-type impurity or a p-type impurity.

The interlayer insulating layer 52 is formed on the gate electrode 50. The interlayer insulating layer 52 electrically separates the gate electrode 50 and the source electrode 42. The interlayer insulating layer 52 is, for example, silicon oxide.

The source electrode 42 is positioned on the first plane P1 side of the silicon carbide layer 10. The source electrode 42 is electrically connected to the source region 60 and the p-well contact region 62. The source electrode 42 also functions as a p-well electrode that applies an electric potential to the p-well region 58. The source electrode 42 is in contact with the metal silicide layer 43.

The source electrode 42 contains metal. The source electrode 42 is, for example, aluminum, an aluminum alloy, tungsten, or copper.

The source electrode 42 may include, for example, a barrier metal film (not illustrated) between the source electrode 42 and the metal silicide layer 43. The barrier metal film is, for example, titanium or titanium nitride.

A carbon concentration of the source electrode 42 is $1\times10^{17}$ cm$^{-3}$ or less.

The metal silicide layer 43 is provided between the silicon carbide layer 10 and the source electrode 42. The metal silicide layer 43 is an example of the conductive layer. The metal silicide layer 43 is in contact with the silicon carbide layer 10. The metal silicide layer 43 is in contact with the source electrode 42.

The metal silicide layer 43 contains a silicide of one metal element (M) selected from the group consisting of nickel (Ni), palladium (Pd), and platinum (Pt). The metal silicide layer 43 contains a nickel silicide, a palladium silicide, or a platinum silicide. The metal silicide layer 43 is, for example, a nickel silicide, a palladium silicide, or a platinum silicide.

The carbon concentration of the metal silicide layer 43 is $1\times10^{17}$ cm$^{-3}$ or less.

An atomic ratio (M/Si) of the metal element to silicon (Si) in the metal silicide layer 43 is 1.2 or more, for example. For example, it is assumed that the metal silicide layer 14 is a nickel silicide. Nickel has silicide phases represented by composition formulas of $Ni_{31}Si_{12}$, $Ni_2Si$, $NiSi$, and $NiSi_2$. Atomic ratios (Ni/Si) of nickel to silicon (Si) of $Ni_{31}Si_{12}$, $Ni_2Si$, $NiSi$, and $NiSi_2$ are 2.6, 2.0, 1.0, and 0.5, respectively.

An impurity concentration of the metal silicide layer 43 is, for example, $1\times10^{17}$ cm$^{-3}$ or less. An aluminum concentration of the metal silicide layer 43 is, for example, $1\times10^{17}$ cm$^{-3}$ or less. A phosphorus concentration of the metal silicide layer 43 is, for example, $1\times10^{17}$ cm$^{-3}$ or less.

A thickness of the metal silicide layer 43 in a direction normal to the first plane P1 of the silicon carbide layer 10 is, for example, 50 nm or more and 500 nm or less. The thickness of the metal silicide layer 43 in the direction normal to the first plane P1 of the silicon carbide layer 10 is preferably larger than 100 nm.

A depth of an interface between the silicon carbide layer 10 and the metal silicide layer 43 is, for example, 50 nm or more and 200 nm or less.

The depth of the interface between the silicon carbide layer 10 and the metal silicide layer 43 is shallower than the depth of the source region 60, for example.

The depth of the interface between the silicon carbide layer 10 and the metal silicide layer 43 is shallower than the depth of the p-well contact region 62, for example.

The drain electrode 44 is positioned on the second plane P2 side of the silicon carbide layer 10. The drain electrode 44 is in contact with the drain region 54. The drain electrode 44 is electrically connected to the drain region 54.

The drain electrode 44 is, for example, nickel. Nickel may react with the silicon carbide layer 10 to form a nickel silicide. The nickel silicide is, for example, NiSi or $Ni_2Si$.

Next, an example of a method for manufacturing the semiconductor device of the third embodiment will be described.

FIGS. 14, 15, 16, 17, 18, 19, 20, 21, 22, and 23 are schematic cross-sectional views illustrating the method for manufacturing the semiconductor device of the third embodiment. FIGS. 14, 15, 16, 17, 18, 19, 20, 21, 22, and 23 illustrate the cross section corresponding to FIG. 13.

Figure 14:
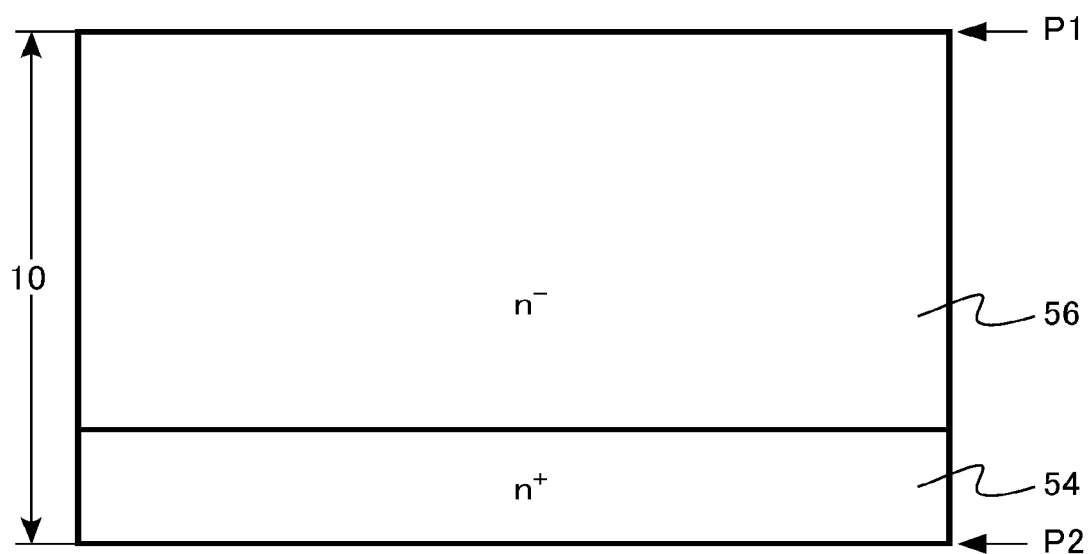
FIG. 14 is a schematic cross-sectional view illustrating a method for manufacturing the semiconductor device of the third embodiment.

First, the silicon carbide layer 10 having the n$^-$-type drift region 56 formed on the drain region 54 is prepared (FIG. 14). The drift region 56 is formed by, for example, an epitaxial growth method. The silicon carbide layer 10 has a first plane P1 and a second plane P2.

Figure 15:
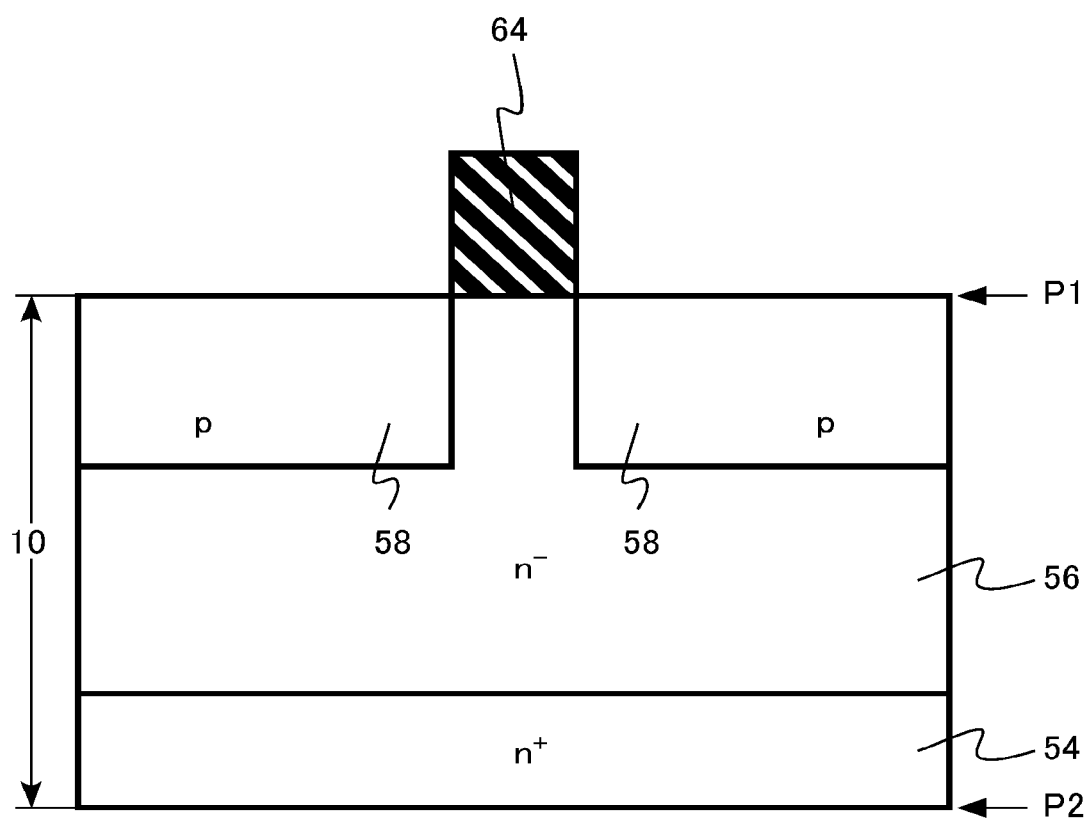
FIG. 15 is a schematic cross-sectional view illustrating the method for manufacturing the semiconductor device of the third embodiment.

Then, a p-type impurity is ion-implanted into the silicon carbide layer 10 using a first mask material 64 as a mask to form the p-well region 58 (FIG. 15). The first mask material 64 is, for example, silicon nitride.

Figure 16:
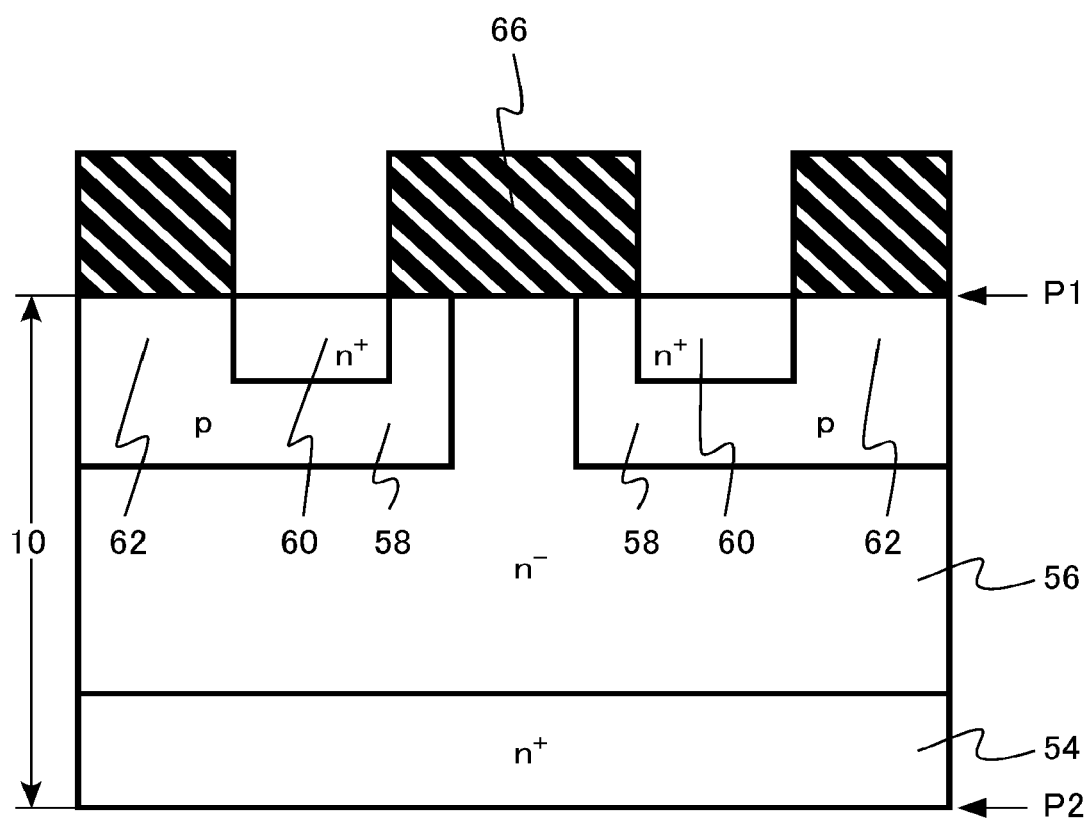
FIG. 16 is a schematic cross-sectional view illustrating the method for manufacturing the semiconductor device of the third embodiment.

Next, an n-type impurity is ion-implanted into silicon carbide layer 10 using a second mask material 66 as a mask to form the source region 60 (FIG. 16). The second mask material 66 is, for example, silicon nitride.

Figure 17:
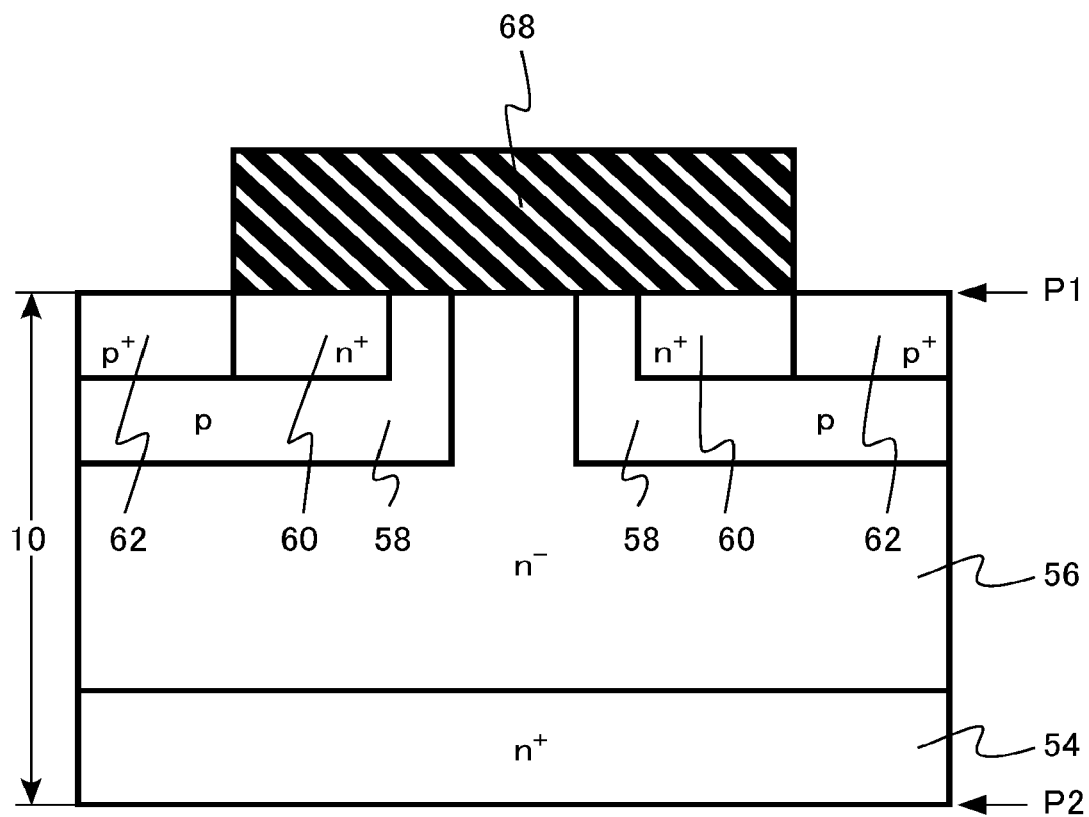
FIG. 17 is a schematic cross-sectional view illustrating the method for manufacturing the semiconductor device of the third embodiment.

Next, a p-type impurity is ion-implanted into the silicon carbide layer 10 using a third mask material 68 as a mask to form the p-well contact region 62 (FIG. 17). The third mask material 68 is, for example, silicon nitride.

Figure 18:
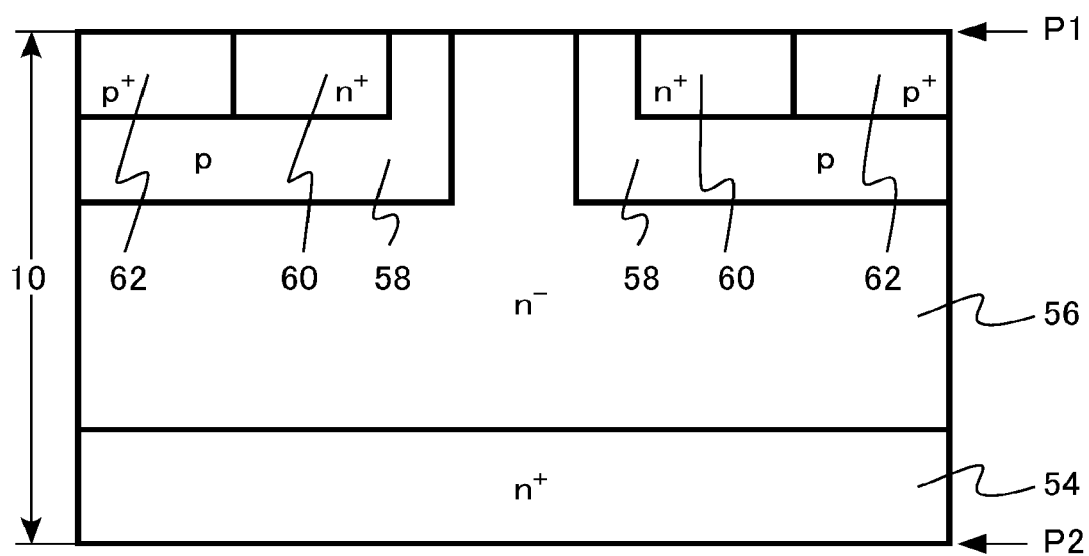
FIG. 18 is a schematic cross-sectional view illustrating the method for manufacturing the semiconductor device of the third embodiment.

Next, the third mask material 68 is peeled off, and heat treatment is performed to activate the p-type impurities and n-type impurities (FIG. 18). The heat treatment is performed, for example, at a temperature of 1600° C. or higher and 2000° C. or lower in an inert gas atmosphere. This heat treatment is so-called activation anneal.

Figure 19:
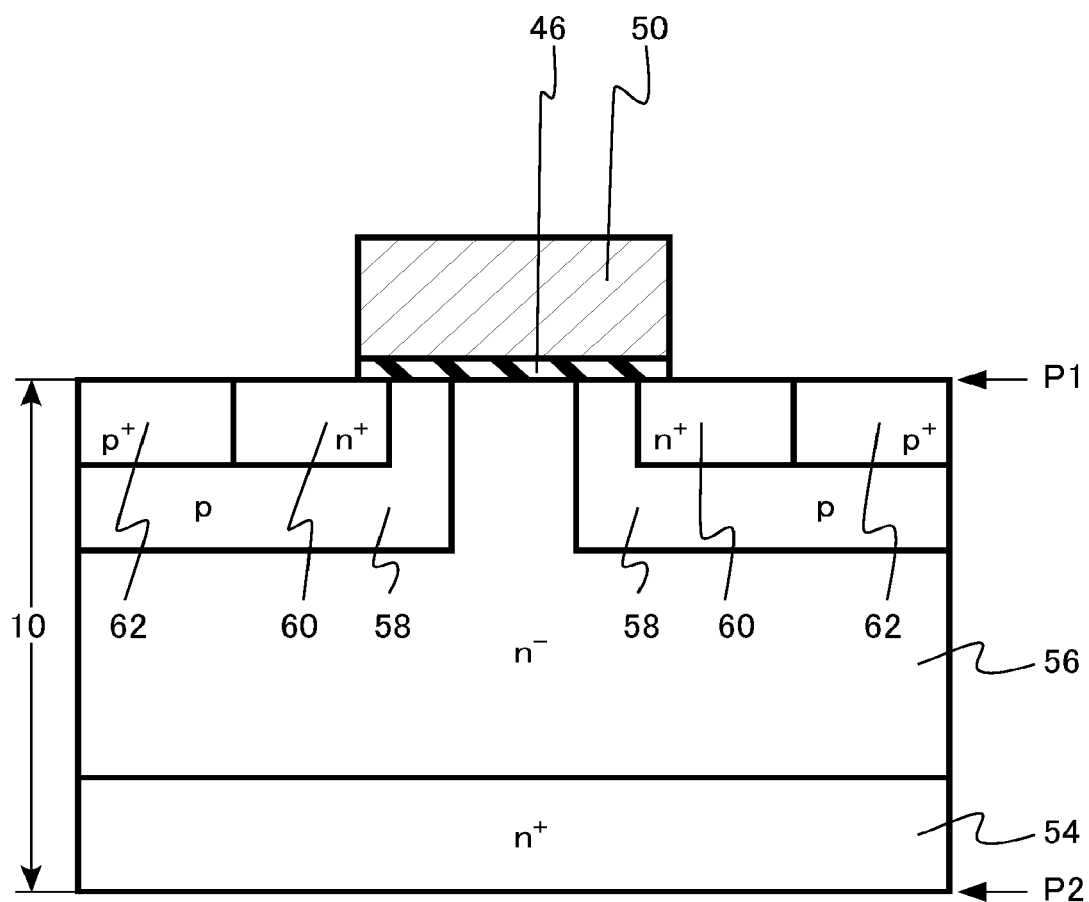
FIG. 19 is a schematic cross-sectional view illustrating the method for manufacturing the semiconductor device of the third embodiment.

Next, the gate insulating layer 46 and the gate electrode 50 are formed on the front surface of the silicon carbide layer 10 (FIG. 19). The gate insulating layer 46 and the gate electrode 50 are formed using, for example, a CVD method, a lithography method, and an RIE method.

Figure 20:
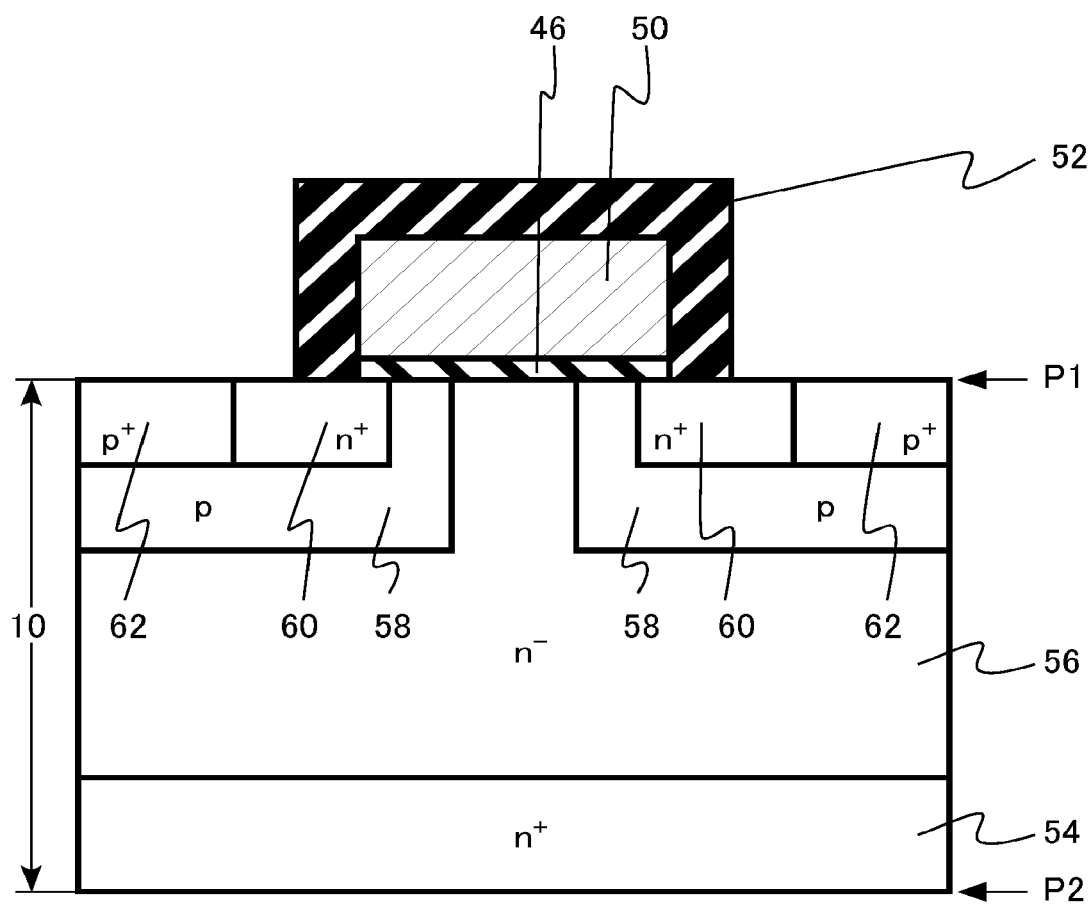
FIG. 20 is a schematic cross-sectional view illustrating the method for manufacturing the semiconductor device of the third embodiment.

Next, the interlayer insulating layer 52 is formed on the gate electrode 50 (FIG. 20).

Figure 21:
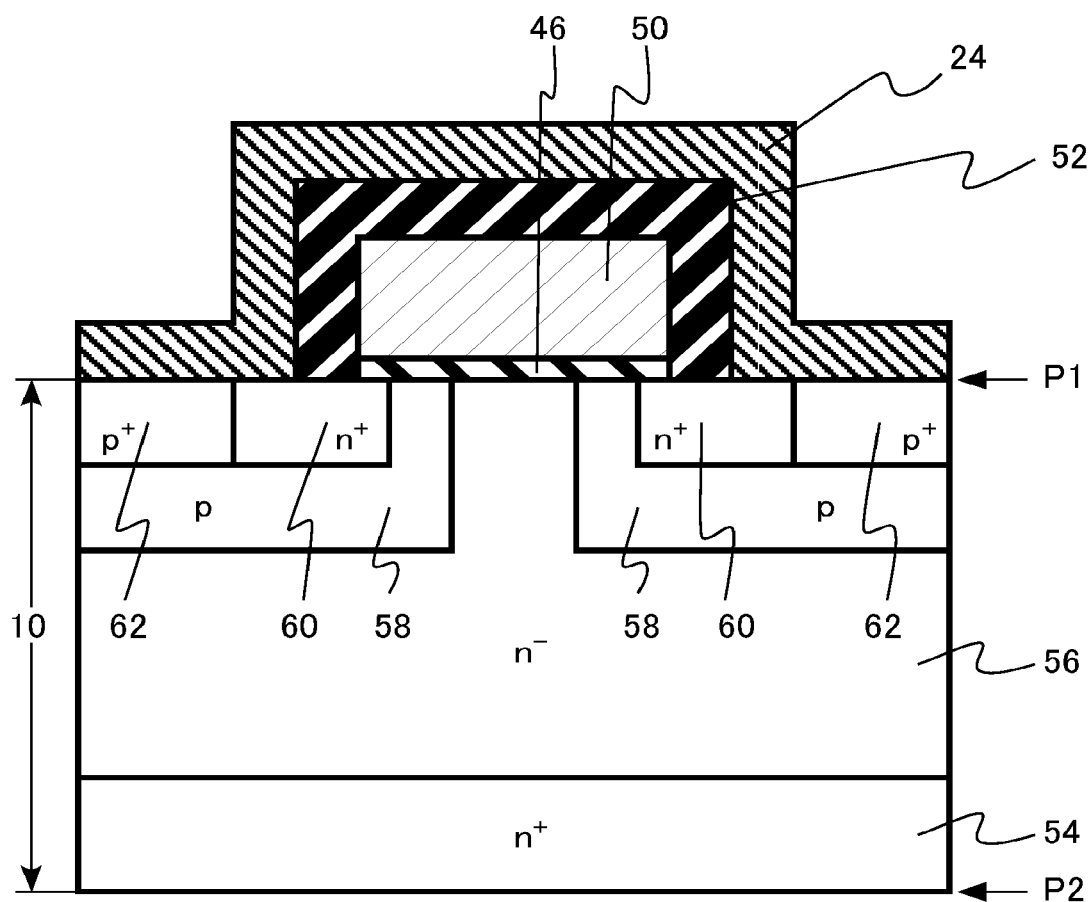
FIG. 21 is a schematic cross-sectional view illustrating the method for manufacturing the semiconductor device of the third embodiment.

Next, the nickel film 24 is formed on the silicon carbide layer 10 (FIG. 21). The nickel film 24 is an example of the first metal film. The nickel film 24 is formed using, for example, a sputtering method.

Figure 22:
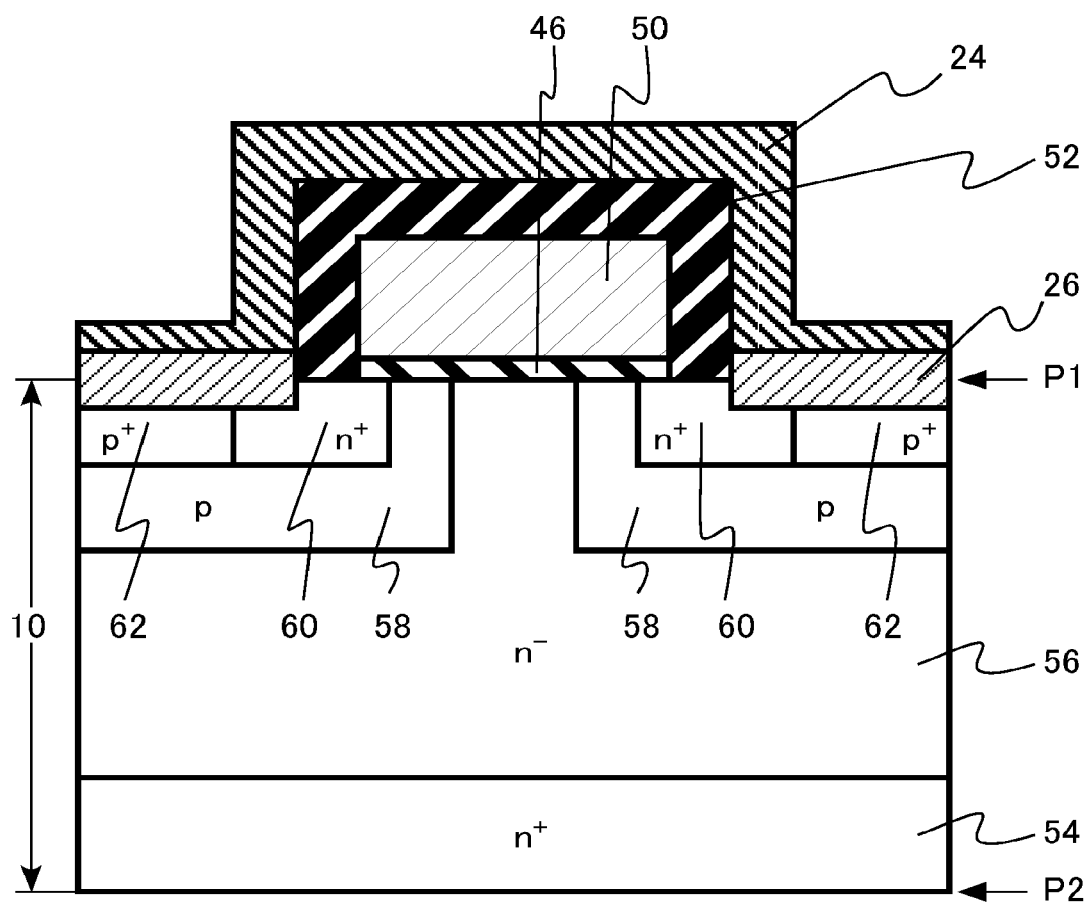
FIG. 22 is a schematic cross-sectional view illustrating the method for manufacturing the semiconductor device of the third embodiment.

Next, heat treatment is performed in an atmosphere containing at least any one of carbon dioxide ($CO_2$) and atomic hydrogen (H). The heat treatment causes the silicon carbide layer 10 to react with the nickel film 24 to form the nickel silicide layer 26 (FIG. 22). The nickel silicide layer 26 is an example of the metal silicide layer 43.

The heat treatment is performed, for example, in an atmosphere containing carbon dioxide. The heat treatment is performed, for example, in an atmosphere containing a carbon dioxide gas. A temperature of the heat treatment is, for example, 500° C. or higher and lower than 900° C.

The atmosphere of the heat treatment may contain a diluent gas. The diluent gas is, for example, a nitrogen gas or an argon gas.

In addition, the heat treatment is performed, for example, in an atmosphere containing atomic hydrogen. The atomic hydrogen is produced by, for example, a heated catalyst method.

In the heated catalyst method, hydrogen molecules are thermally dissociated by a metal filament for thermal dissociation. Atomic elements can be produced by the heated catalyst method. The hydrogen molecules can be dissociated into hydrogen atoms by the heated catalyst method. The metal filament is, for example, tungsten, molybdenum, iron chromium, rhenium, or thorium.

For example, a hydrogen gas is introduced into a heated tungsten filament. Dissociative adsorption of hydrogen molecules occurs on the tungsten filament. Then, atomic hydrogen is thermally desorbed from the tungsten filament. A heating temperature of the tungsten filament is, for example, 1600° C.

A temperature of the heat treatment is, for example, 500° C. or higher and lower than 900° C. The atomic hydrogen generated by the heated catalyst method is introduced into a heat treatment furnace and is subjected to heat treatment using, for example, a carrier gas. The carrier gas is, for example, a nitrogen gas or an argon gas.

Since the silicon carbide layer 10 and the nickel film 24 react during the heat treatment, the depth of the interface between the silicon carbide layer 10 and the metal silicide layer 43 becomes 50 nm or more.

During the heat treatment, the n-type impurities pile up at the interface between the source region 60 and the metal silicide layer 43. Therefore, the n-type impurity concentration at the interface between the source region 60 and the metal silicide layer 43 becomes higher.

In addition, the p-type impurities pile up at the interface between the p-well contact region 62 and the metal silicide layer 43 during the heat treatment. Therefore, the p-type impurity concentration at the interface between the p-well contact region 62 and the metal silicide layer 43 becomes higher.

Figure 23:
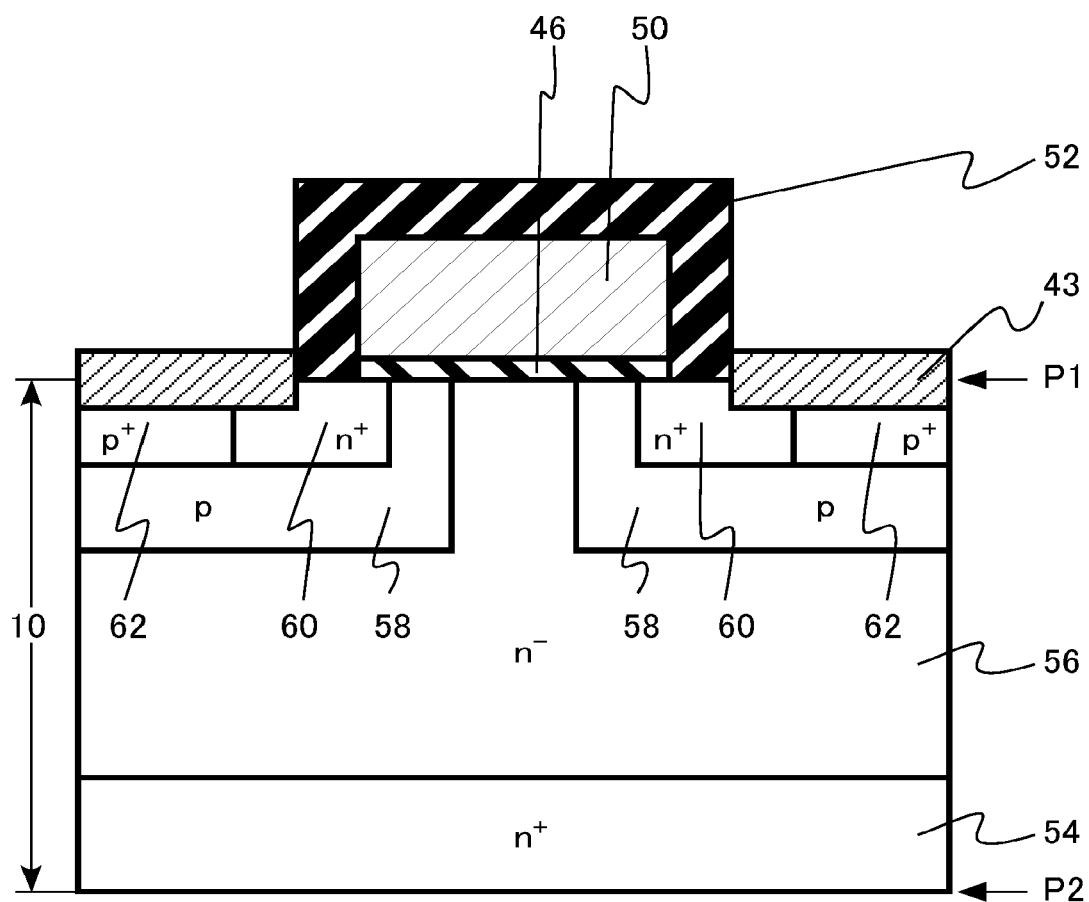
FIG. 23 is a schematic cross-sectional view illustrating the method for manufacturing the semiconductor device of the third embodiment.

Next, the unreacted nickel film 24 is removed (FIG. 23). The nickel film 24 is removed by, for example, wet etching.

Thereafter, the source electrode 42 and the drain electrode 44 are formed using a known process technique. The MOSFET 300 illustrated in FIG. 13 is manufactured according to the above manufacturing method.

According to the third embodiment, the carbon concentration of the metal silicide layer 43 is low so that the contact resistance between the source region 60 and the source electrode 42 decreases. Therefore, the MOSFET 300 having the low on-resistance is achieved.

In addition, the contact resistance between the p-well contact region 62 and the source electrode 42 decreases since the carbon concentration of the metal silicide layer 43 is low according to the third embodiment. Therefore, the MOSFET 300 having stable characteristics is achieved.

As described above, according to the third embodiment, the semiconductor device that reduces the contact resistance between the silicon carbide layer and the metal electrode is provided as in the first and second embodiments.

Fourth Embodiment

A semiconductor device of a fourth embodiment differs from the semiconductor device of the third embodiment in that a depth of a conductive layer is deeper than a depth of a third silicon carbide region. Hereinafter, some of the content overlapping with that in the first, second, or third embodiment will not be described.

Figure 24:
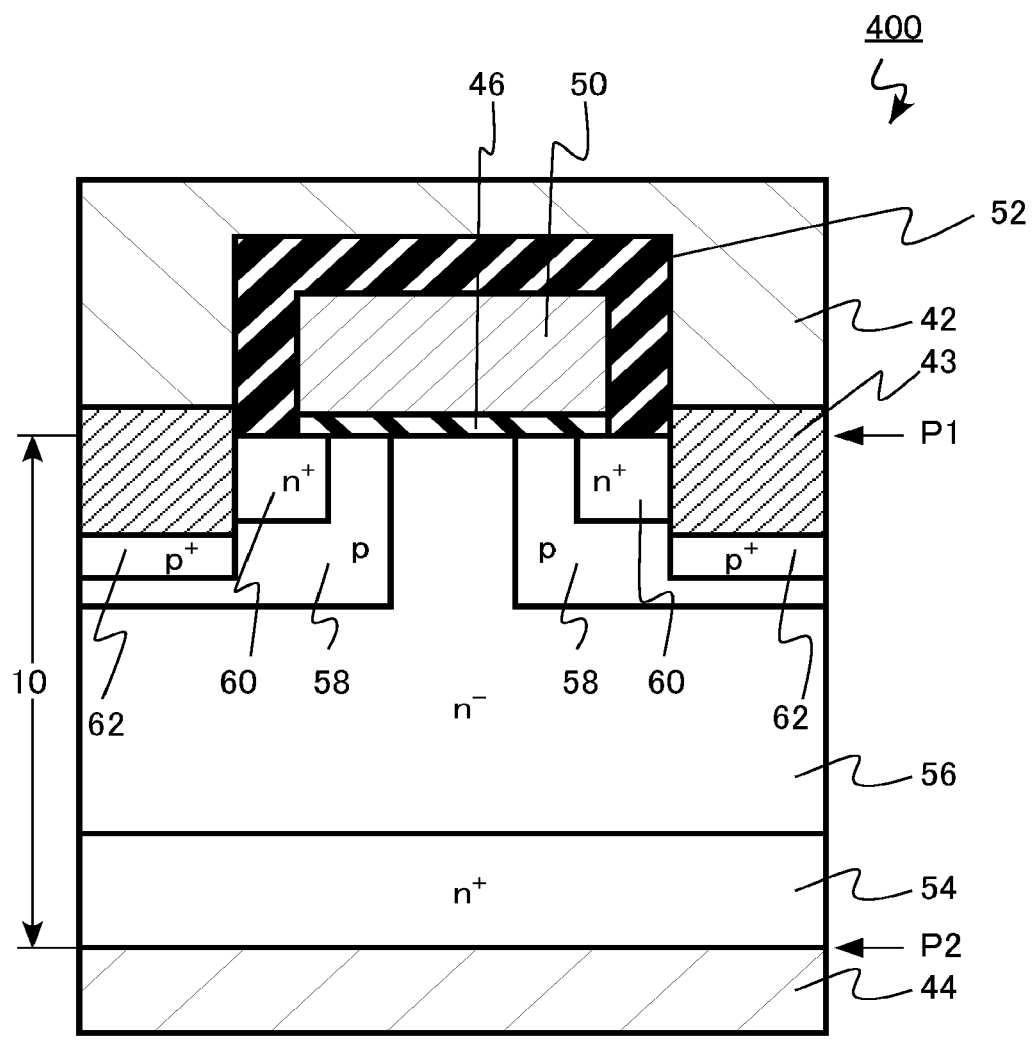
FIG. 24 is a schematic cross-sectional view of a semiconductor device of a fourth embodiment.

FIG. 24 is a schematic cross-sectional view of the semiconductor device of the fourth embodiment. The semiconductor device of the fourth embodiment is a vertical MOSFET 400. The MOSFET 400 is an n-channel transistor that uses electrons as carriers.

The MOSFET 400 includes the silicon carbide layer 10, the source electrode 42 (first electrode and metal layer), the metal silicide layer 43 (conductive layer), the drain electrode 44 (second electrode), the gate insulating layer 46, the gate electrode 50, and the interlayer insulating layer 52 (insulating layer).

The silicon carbide layer 10 includes a drain region 54, a drift region 56 (first silicon carbide region), a p-well region 58 (second silicon carbide region), a source region 60 (third silicon carbide region), and a p-well contact region 62 (fourth silicon carbide region).

The p-well contact region 62 is deeper than the source region 60. In addition, the metal silicide layer 43 is deeper than the source region 60.

In the fourth embodiment, a "depth" means a depth when the first plane P1 is set as a reference. Here, the first plane P1 is a virtual plane including an interface between the silicon carbide layer 10 and the gate insulating layer 46.

Next, an example of a method for manufacturing the semiconductor device of the fourth embodiment will be described.

FIGS. 25, 26, 27, 28, 29, 30, 31, 32, 33, and 34 are schematic cross-sectional views illustrating the method for manufacturing the semiconductor device of the fourth embodiment. FIGS. 25, 26, 27, 28, 29, 30, 31, 32, 33, and 34 illustrate the cross section corresponding to FIG. 24.

Figure 25:
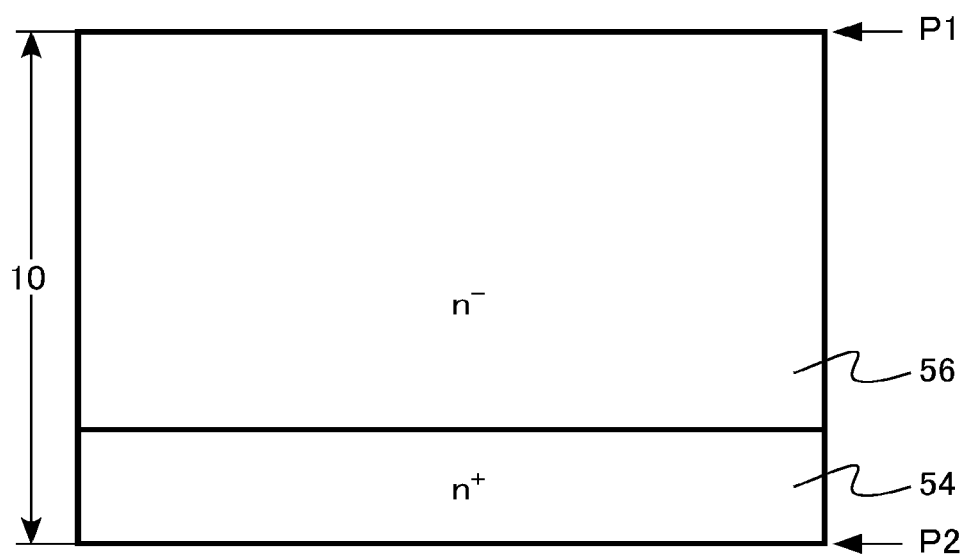
FIG. 25 is a schematic cross-sectional view illustrating a method for manufacturing the semiconductor device of the fourth embodiment.

First, the silicon carbide layer 10 having the n$^-$-type drift region 56 formed on the drain region 54 is prepared (FIG. 25). The drift region 56 is formed by, for example, an epitaxial growth method. The silicon carbide layer 10 has a first plane P1 and a second plane P2.

Figure 26:
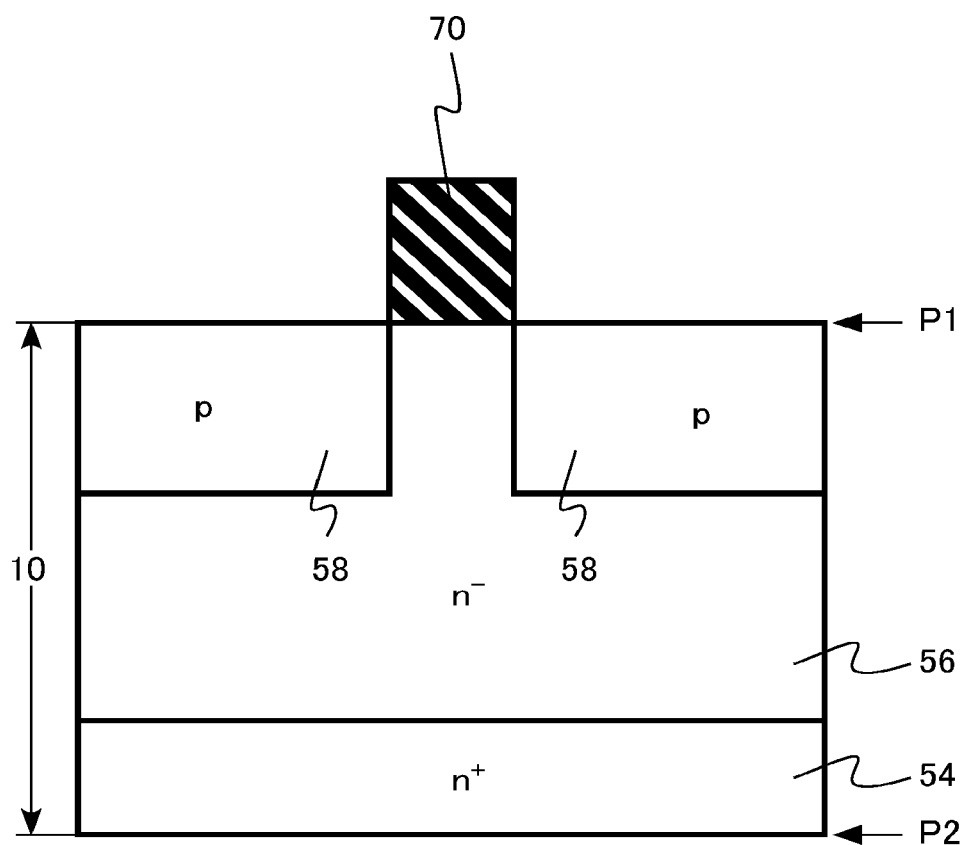
FIG. 26 is a schematic cross-sectional view illustrating the method for manufacturing the semiconductor device of the fourth embodiment.

Then, a p-type impurity is ion-implanted into the silicon carbide layer 10 using a mask material 70 as a mask to form the p-well region 58 (FIG. 26). The mask material 70 is, for example, silicon nitride.

Figure 27:
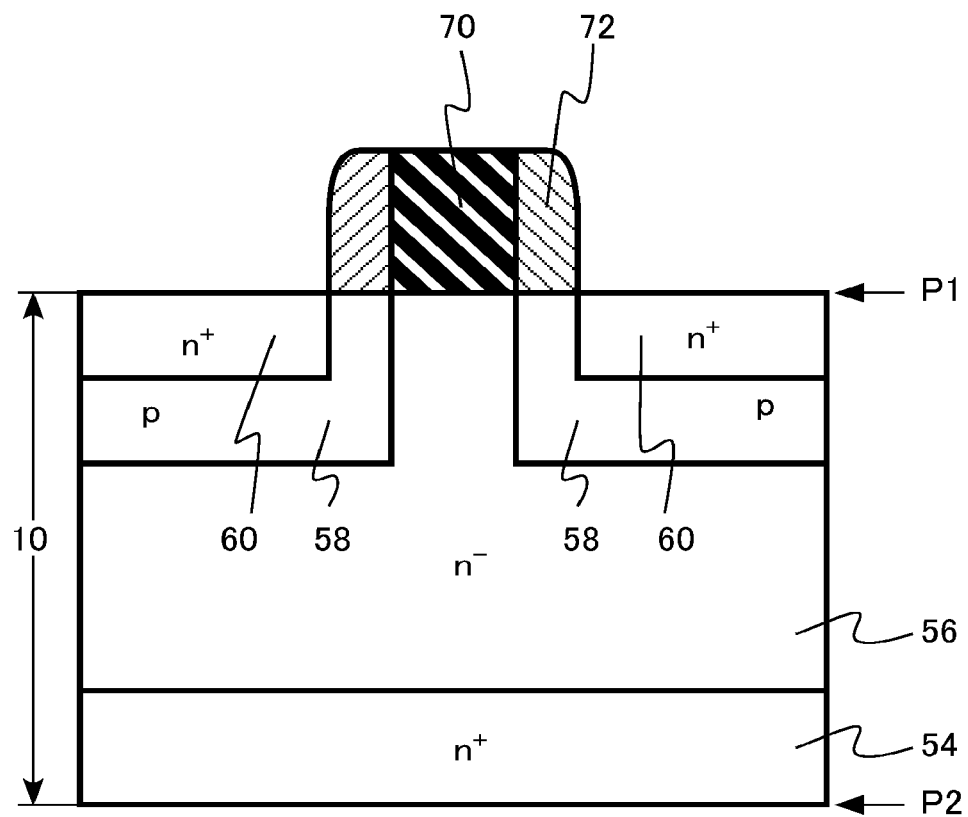
FIG. 27 is a schematic cross-sectional view illustrating the method for manufacturing the semiconductor device of the fourth embodiment.

Next, a first sidewall 72 is formed. Next, an n-type impurity is ion-implanted into the silicon carbide layer 10 using the mask material 70 and the first sidewall 72 as a mask to form the source region 60 (FIG. 27). The first sidewall 72 is, for example, silicon oxide.

Figure 28:
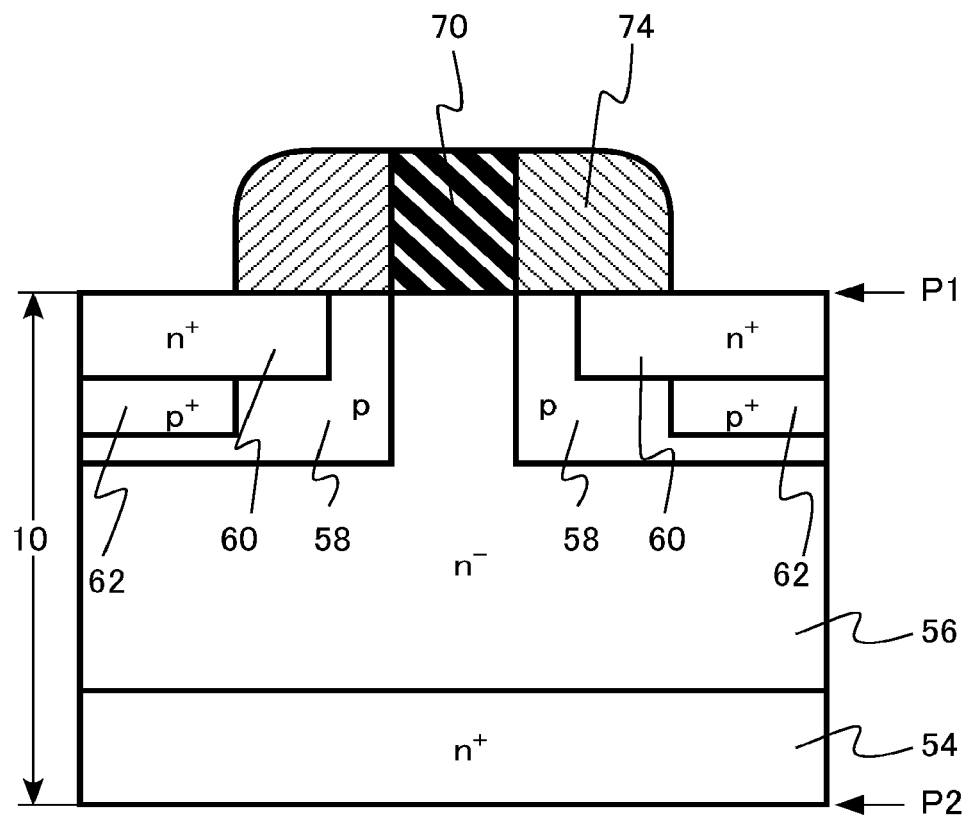
FIG. 28 is a schematic cross-sectional view illustrating the method for manufacturing the semiconductor device of the fourth embodiment.

Next, the first sidewall 72 is peeled off, and then, a second sidewall 74 is formed. Next, a p-type impurity is ion-implanted into the silicon carbide layer 10 using the mask material 70 and the second sidewall 74 as a mask to form the p-well contact region 62 (FIG. 28). The second sidewall 74 is, for example, silicon oxide.

The p-well contact region 62 is formed so as to be deeper than the source region 60. In addition, the p-well contact region 62 is formed so as to be shallower than the p-well region 58.

Figure 29:
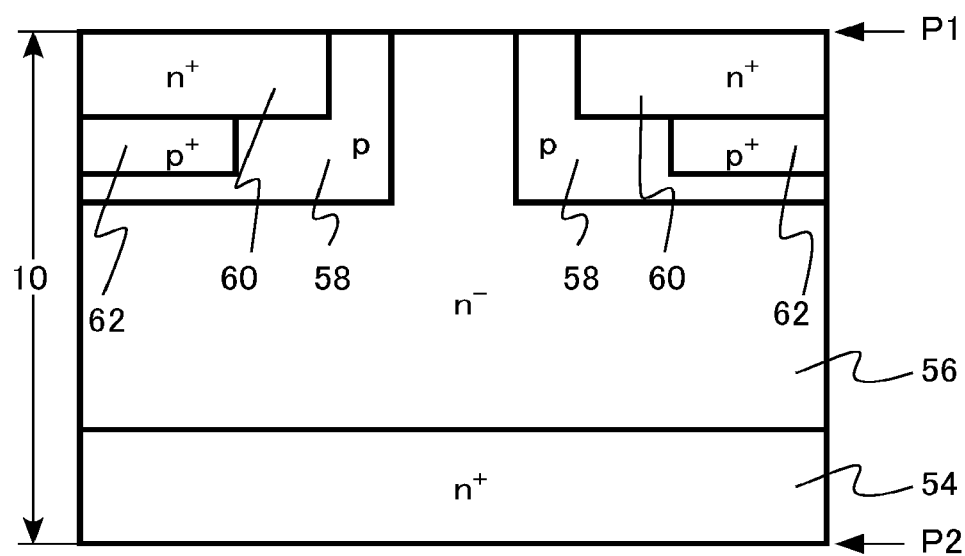
FIG. 29 is a schematic cross-sectional view illustrating the method for manufacturing the semiconductor device of the fourth embodiment.

Next, the mask material 70 and the second sidewall 74 are peeled off, and heat treatment is performed to activate the p-type impurities and n-type impurities (FIG. 29). The heat treatment is performed, for example, at a temperature of 1500° C. or higher in an inert gas atmosphere.

Figure 30:
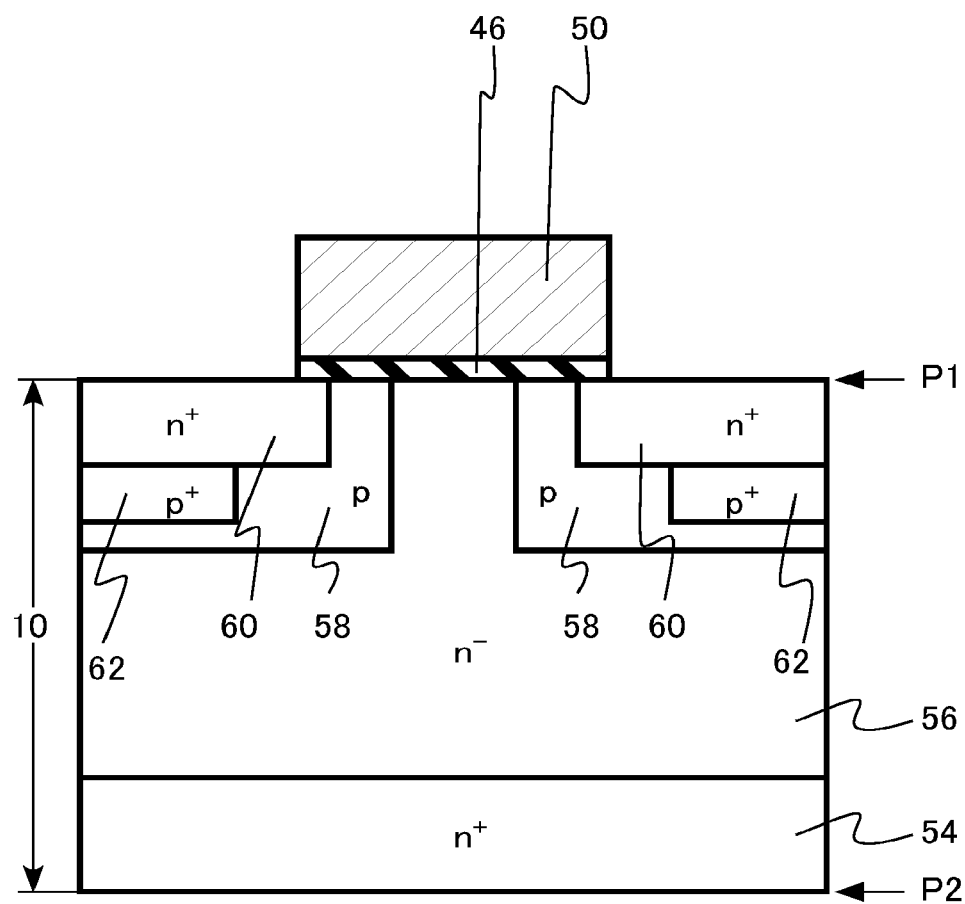
FIG. 30 is a schematic cross-sectional view illustrating the method for manufacturing the semiconductor device of the fourth embodiment.

Next, the gate insulating layer 46 and the gate electrode 50 are formed on the front surface of the silicon carbide layer 10. The gate insulating layer 46 and the gate electrode 50 are formed using, for example, a CVD method, a lithography method, and an RIE method (FIG. 30).

Figure 31:
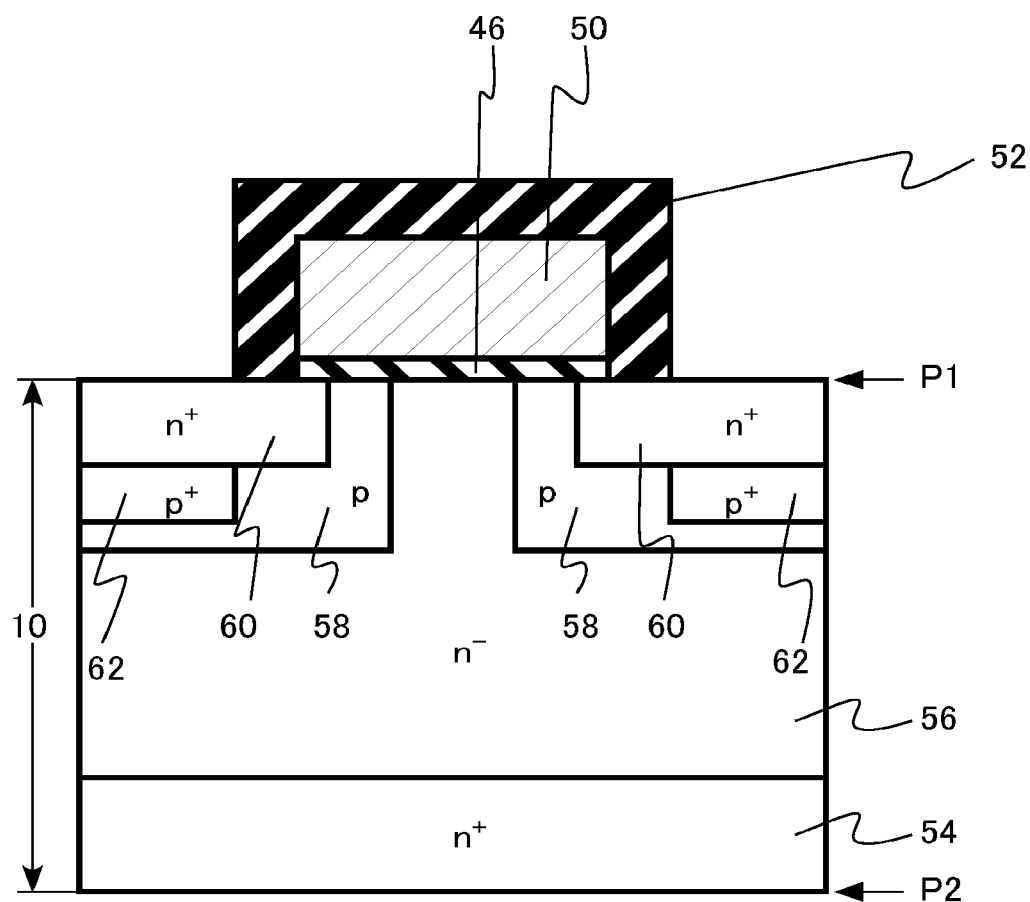
FIG. 31 is a schematic cross-sectional view illustrating the method for manufacturing the semiconductor device of the fourth embodiment.

Next, the interlayer insulating layer 52 is formed on the gate electrode 50 (FIG. 31).

Figure 32:
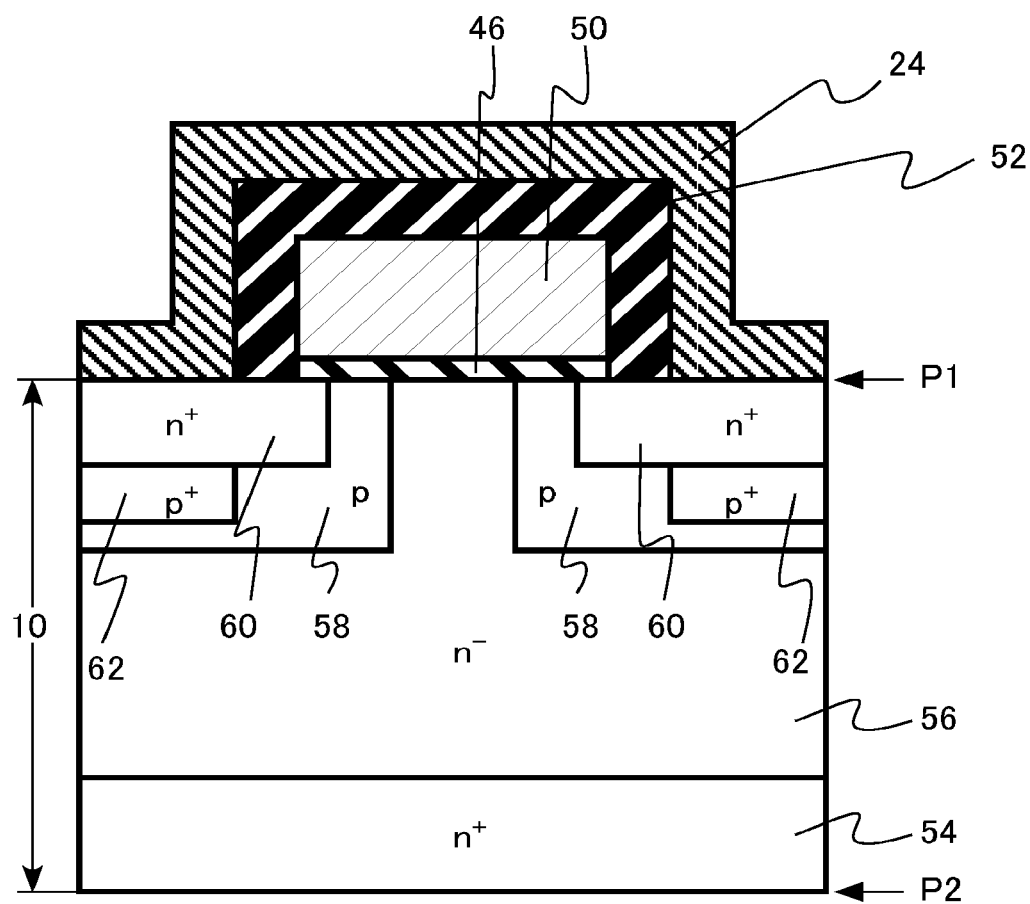
FIG. 32 is a schematic cross-sectional view illustrating the method for manufacturing the semiconductor device of the fourth embodiment.

Next, the nickel film 24 is formed on the silicon carbide layer 10 (FIG. 32). The nickel film 24 is an example of the first metal film. The nickel film 24 is formed using, for example, a sputtering method.

Figure 33:
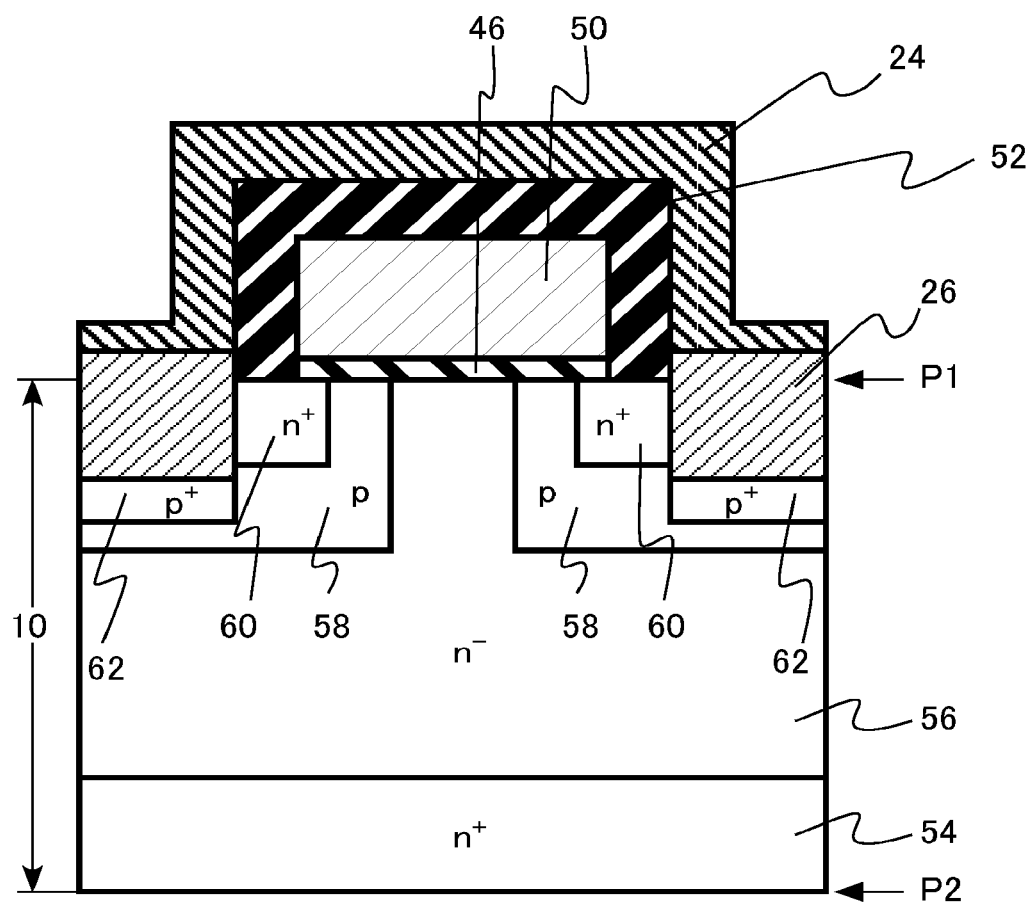
FIG. 33 is a schematic cross-sectional view illustrating the method for manufacturing the semiconductor device of the fourth embodiment.

Next, heat treatment is performed in an atmosphere containing at least any one of carbon dioxide ($CO_2$) and atomic hydrogen (H). The heat treatment causes the silicon carbide layer 10 to react with the nickel film 24 to form the nickel silicide layer 26 (FIG. 33). The nickel silicide layer 26 is an example of the metal silicide layer 43.

Figure 34:
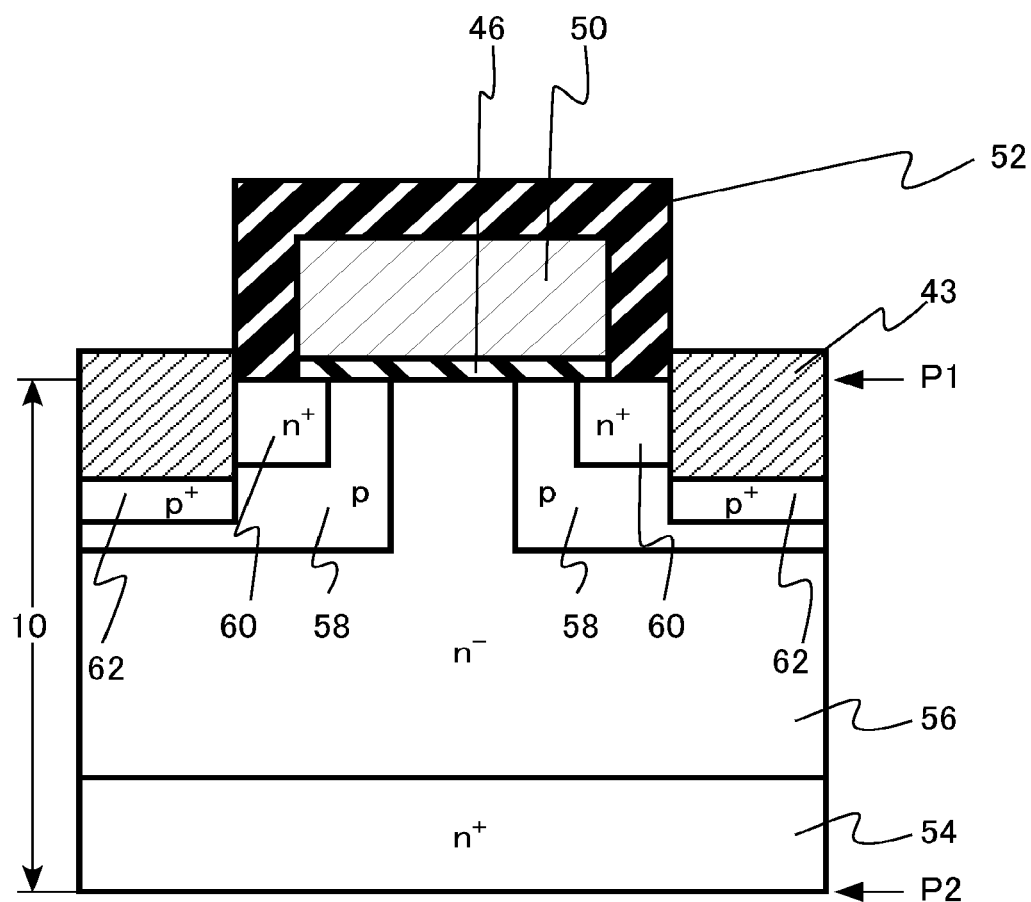
FIG. 34 is a schematic cross-sectional view illustrating the method for manufacturing the semiconductor device of the fourth embodiment.

Next, the unreacted nickel film 24 is removed (FIG. 34). The nickel film 24 is removed by, for example, wet etching.

Thereafter, the source electrode 42 and the drain electrode 44 are formed using a known process technique. The MOSFET 400 illustrated in FIG. 24 is manufactured according to the above manufacturing method.

According to the fourth embodiment, the carbon concentration of the metal silicide layer 43 is low so that the contact resistance between the source region 60 and the source electrode 42 decreases. Therefore, the MOSFET 400 having the low on-resistance is achieved.

In addition, the contact resistance between the p-well contact region 62 and the source electrode 42 decreases since the carbon concentration of the metal silicide layer 43 is low according to the fourth embodiment. Therefore, the MOSFET 400 having stable characteristics is achieved.

In addition, the metal silicide layer 43 and the source region 60 are in contact with each other mainly on a side surface of the metal silicide layer 43 according to the fourth embodiment. Due to the contact on the side surface, the metal silicide layer 43 has a depth of preferably 50 nm or more, and more preferably 100 nm or more so as to obtain a sufficient contact area. Even more preferably, the thickness of the metal silicide layer 43 is larger than 100 nm. The area occupied by the source electrode 42 on the first plane P1 of the silicon carbide layer 10 can be reduced, and the MOSFET 400 can be miniaturized. Therefore, the on-resistance per unit area of the MOSFET 400 can be reduced.

In addition, according to the method for manufacturing the semiconductor device of the fourth embodiment, the p-well region 58 (second silicon carbide region), the source region 60 (third silicon carbide region), and the p-well contact region 62 (fourth silicon carbide region) can be formed in a self-aligned manner. Therefore, the MOSFET 400 can be miniaturized, and the on-resistance per unit area of the MOSFET 400 can be reduced.

As described above, according to the fourth embodiment, the semiconductor device that reduces the contact resistance between the silicon carbide layer and the metal electrode is provided as in the first, second, and third embodiments.

Fifth Embodiment

A semiconductor device of a fifth embodiment differs from the semiconductor device of the fourth embodiment in that a gate electrode is provided in a trench. Hereinafter, some of the content overlapping with that in the first, second, third, or fourth embodiment will not be described.

Figure 35:
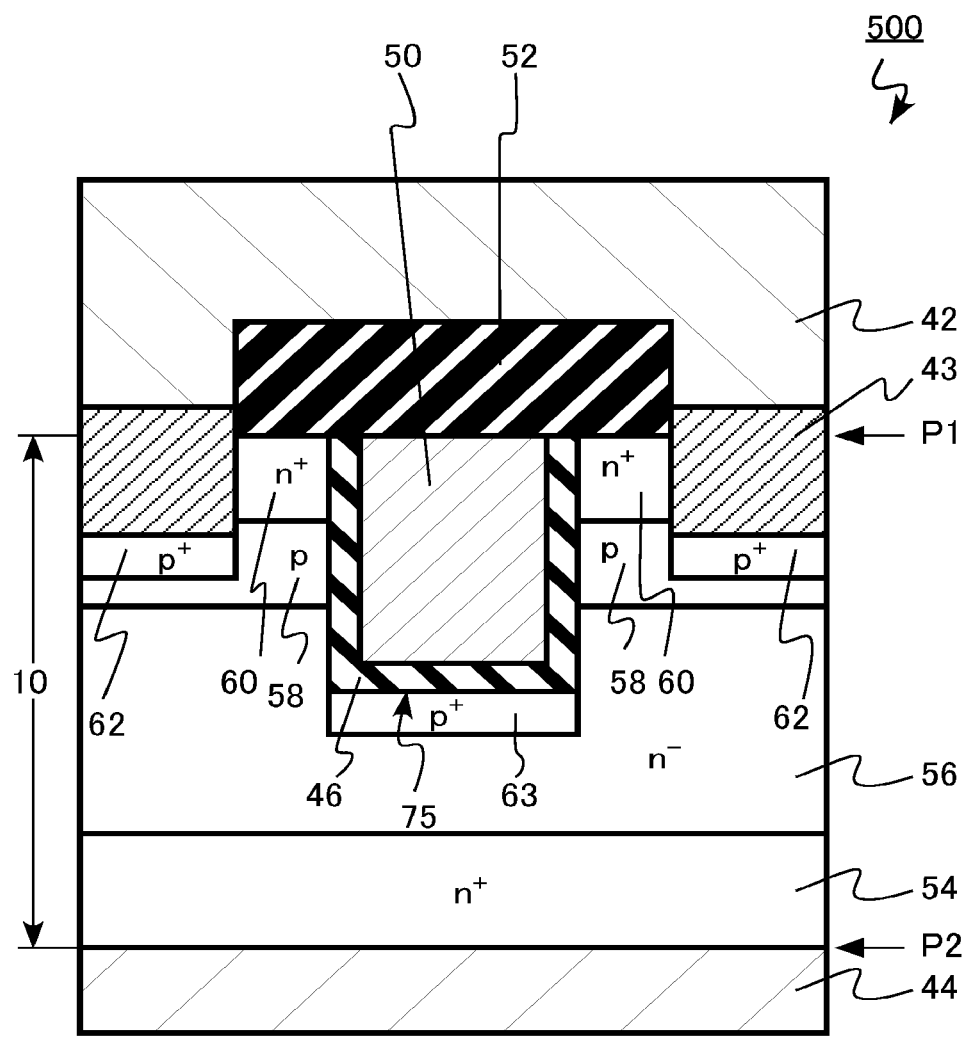
FIG. 35 is a schematic cross-sectional view of a semiconductor device of a fifth embodiment.

FIG. 35 is a schematic cross-sectional view of the semiconductor device of the fifth embodiment. The semiconductor device of the fifth embodiment is a vertical MOSFET 500. The MOSFET 500 is a MOSFET having a trench gate structure in which the gate electrode is provided in the trench. The MOSFET 500 is an n-channel transistor that uses electrons as carriers.

The MOSFET 500 includes the silicon carbide layer 10, the source electrode 42 (first electrode and metal layer), the metal silicide layer 43 (conductive layer), the drain electrode 44 (second electrode), the gate insulating layer 46, the gate electrode 50, and the interlayer insulating layer 52 (insulating layer).

The silicon carbide layer 10 includes the drain region 54, the drift region 56 (first silicon carbide region), the p-well region 58 (second silicon carbide region), the source region 60 (third silicon carbide region), the p-well contact region 62 (fourth silicon carbide region), an electric field relaxation region 63, and a trench 75.

The p-well contact region 62 is deeper than the source region 60. In addition, the metal silicide layer 43 is deeper than the source region 60.

In the fifth embodiment, a "depth" means a depth when the first plane P1 is set as a reference. Here, the first plane P1 is a virtual plane including an interface between the silicon carbide layer 10 and the gate insulating layer 46.

The trench 75 is provided on the first plane P1 side of the silicon carbide layer 10. A depth of the trench 75 is deeper than a depth of the p-well region 58.

The gate insulating layer 46 is provided in the trench 75. The gate electrode 50 is provided in the trench 75. The gate electrode 50 is provided on the gate insulating layer 46.

The electric field relaxation region 63 is $p^+$-type SiC. The electric field relaxation region 63 is provided between the drift region 56 and the trench 75. The electric field relaxation region 63 is provided at the bottom of the trench 75. The electric field relaxation region 63 has a function of reducing the intensity of an electric field applied to the gate insulating layer 46 in the trench 75.

The electric field relaxation region 63 contains, for example, aluminum as a p-type impurity. A p-type impurity concentration of the electric field relaxation region 63 is, for example, $1 \times 10^{18}$ cm$^{-3}$ or more and $1 \times 10^{22}$ cm$^{-3}$ or less. The p-type impurity concentration of electric field relaxation region 63 is higher than a p-type impurity concentration of p-well region 58.

In the MOSFET 500 of the fifth embodiment, the trench 75 is formed in the silicon carbide layer 10. The gate insulating layer 46 and the gate electrode 50 are formed in the trench 75. A method for manufacturing the other components is the same as the method for manufacturing the MOSFET 400 of the fourth embodiment.

According to the MOSFET 500 of the fifth embodiment, the provision of the trench gate structure enables miniaturization, and the on-resistance per unit area can be reduced.

As described above, according to the fifth embodiment, the semiconductor device that reduces the contact resistance between the silicon carbide layer and the metal electrode is provided as in the first, second, third, and fourth embodiments.

Sixth Embodiment

An inverter circuit and a driving device according to a sixth embodiment correspond to an inverter circuit and a driving device that includes the semiconductor device according to the third embodiment.

Figure 36:
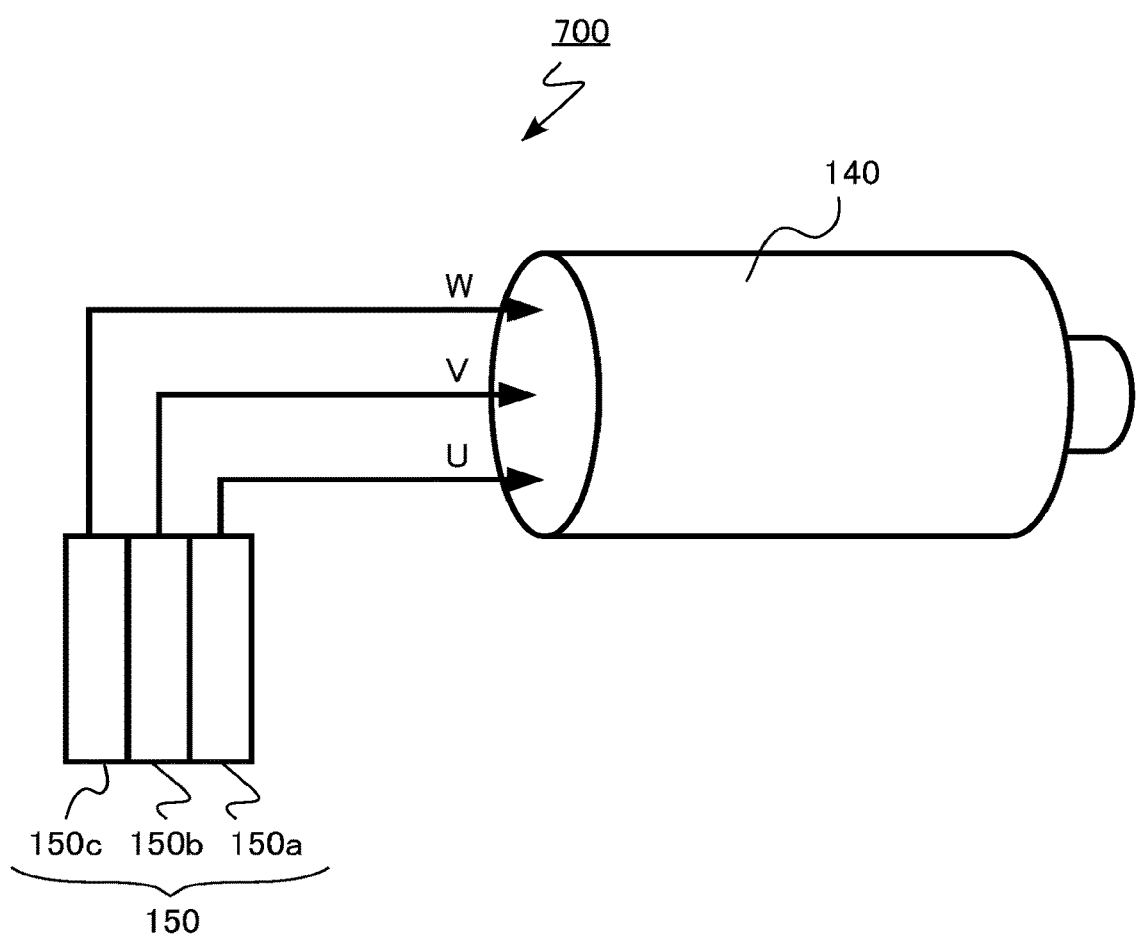
FIG. 36 is a schematic view of a driving device of a sixth embodiment.

FIG. 36 is a schematic view of the driving device of the sixth embodiment. A driving device 700 includes a motor 140 and an inverter circuit 150.

The inverter circuit 150 includes three semiconductor modules 150a, 150b, and 150c using the MOSFET 300 of the third embodiment as a switching element. The three-phase inverter circuit 150 having three AC voltage output terminals U, V, and W is realized by connecting the three semiconductor modules 150a, 150b, and 150c in parallel. The motor 140 is driven by the AC voltage output from the inverter circuit 150.

According to the sixth embodiment, characteristics of the inverter circuit 150 and the driving device 700 are improved by providing the MOSFET 300 with improved characteristics.

Seventh Embodiment

A vehicle of a seventh embodiment is a vehicle including the semiconductor device of the third embodiment.

Figure 37:
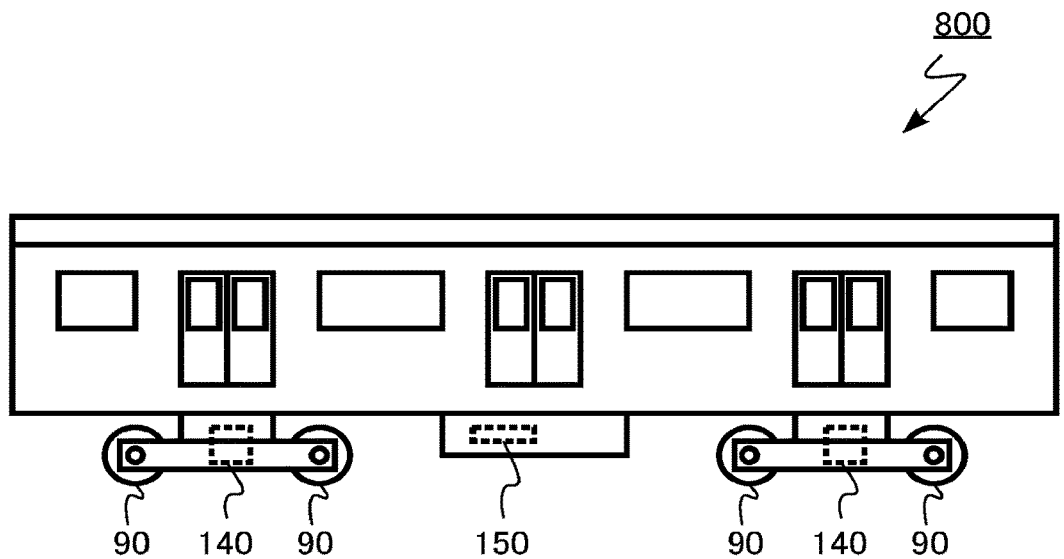
FIG. 37 is a schematic view of a vehicle of a seventh embodiment.

FIG. 37 is a schematic view of the vehicle of the seventh embodiment. A vehicle 800 of the seventh embodiment is a railway vehicle. The vehicle 800 includes a motor 140 and an inverter circuit 150.

The inverter circuit 150 includes three semiconductor modules using the MOSFET 300 of the third embodiment as a switching element. The three-phase inverter circuit 150 having three AC voltage output terminals U, V, and W is realized by connecting the three semiconductor modules in parallel. The motor 140 is driven by the AC voltage output from the inverter circuit 150. Wheels 90 of the vehicle 800 are rotated by the motor 140.

According to the seventh embodiment, characteristics of the vehicle 800 are improved by providing the MOSFET 300 with improved characteristics.

Eighth Embodiment

A vehicle of an eighth embodiment is a vehicle including the semiconductor device of the third embodiment.

Figure 38:
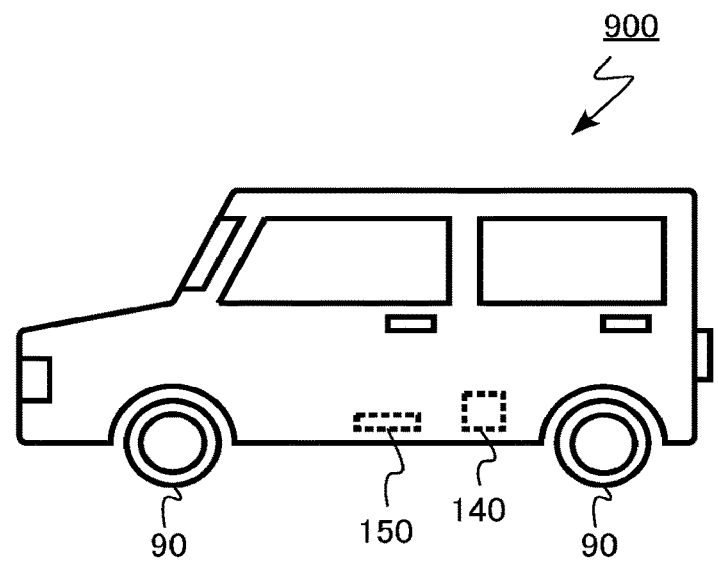
FIG. 38 is a schematic view of a vehicle of an eighth embodiment.

FIG. 38 is a schematic view of the vehicle of the eighth embodiment. A vehicle 900 of the eighth embodiment is a car. The vehicle 900 includes a motor 140 and an inverter circuit 150.

The inverter circuit 150 includes three semiconductor modules using the MOSFET 300 of the third embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. Wheels 90 of the vehicle 900 are rotated by the motor 140.

According to the eighth embodiment, characteristics of the vehicle 900 are improved by providing the MOSFET 300 with improved characteristics.

Ninth Embodiment

An elevator of a ninth embodiment is an elevator including the semiconductor device of the third embodiment.

Figure 39:
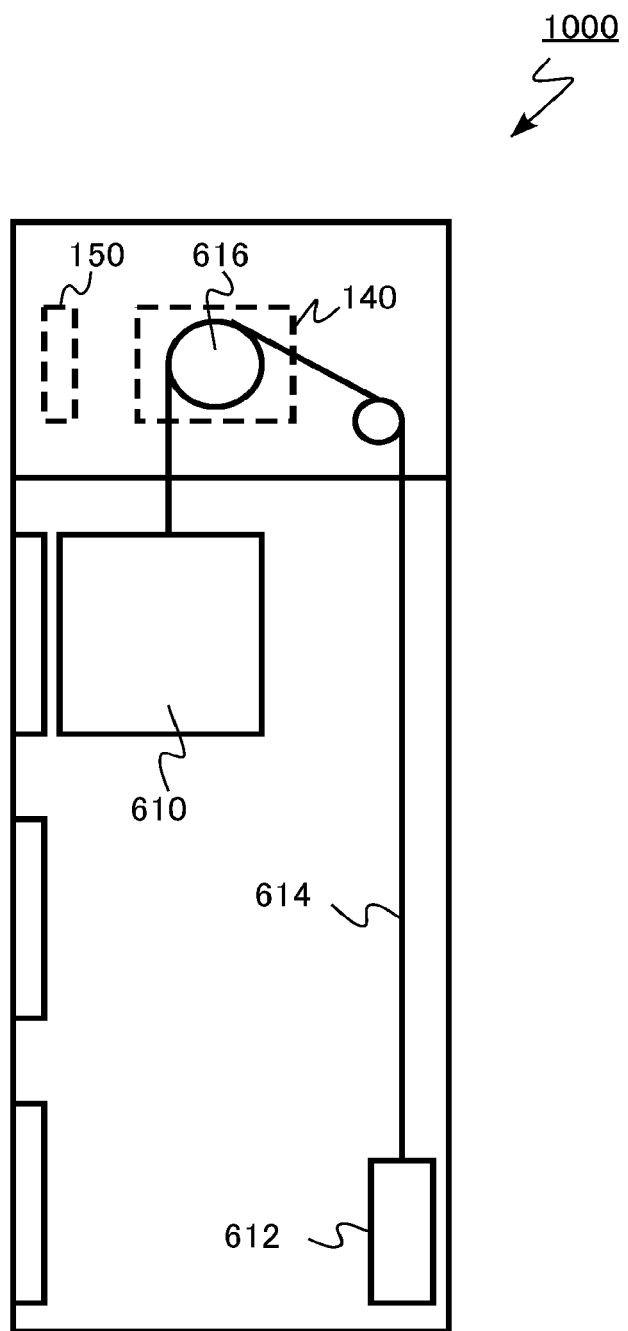
FIG. 39 is a schematic view of an elevator of a ninth embodiment.

FIG. 39 is a schematic view of the elevator of the ninth embodiment. An elevator 1000 of the ninth embodiment includes an elevator car 610, a counterweight 612, a wire rope 614, a hoisting machine 616, a motor 140, and an inverter circuit 150.

The inverter circuit 150 includes three semiconductor modules using the MOSFET 300 of the third embodiment as a switching element. The three-phase inverter circuit 150 having three AC voltage output terminals U, V, and W is realized by connecting the three semiconductor modules in parallel.

The motor 140 is driven by the AC voltage output from the inverter circuit 150. The hoisting machine 616 is rotated by the motor 140 to move the elevator car 610 up and down.

According to the ninth embodiment, characteristics of the elevator 1000 are improved by providing the MOSFET 300 with improved characteristics.

As described above, the description has been given in the first to fifth embodiments by exemplifying the case of 4H—SiC as the crystal structure of silicon carbide, but the present disclosure can also be applied to silicon carbide having another crystal structure of 3C—SiC or 6H—SiC.

In addition, the present disclosure can be applied to other semiconductor devices using silicon carbide such as a diode and an insulated gate bipolar transistor (IGBT).

In addition, the present disclosure can also be applied to not the vertical transistor but a horizontal transistor in which a source electrode and a drain electrode are provided on the same plane of a silicon carbide layer.

Although the case where the n-type impurity is nitrogen or phosphorus has been described as an example in the first to fifth embodiments, arsenic (As) or antimony (Sb) can also be applied as the n-type impurity.

Although the case where the p-type impurity is aluminum or boron has been described as an example in the first to fifth embodiments, gallium (Ga) or indium (In) can also be applied as the p-type impurity.

In addition, the description has been given in the sixth to ninth embodiments by exemplifying the case where the semiconductor device of the present disclosure is applied to a vehicle or an elevator has been described as an example, but the semiconductor device of the present disclosure can also be applied to, for example, a power conditioner of a photovoltaic power generation system or the like.

Although the case where the semiconductor device of the third embodiment is applied has been described as an example in the sixth to ninth embodiments, the semiconductor device of the fourth or fifth embodiment can also be applied, for example.

While certain embodiments have been described, these embodiments have been presented by way of example only, and are not intended to limit the scope of the inventions. Indeed, the semiconductor device, the method for manufacturing the semiconductor device, the inverter circuit, the driving device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
    forming a first metal film on a silicon carbide layer, the first metal film containing one metal element (M) selected from a group consisting of nickel (Ni), palladium (Pd), and platinum (Pt);
    heat treating, in an atmosphere containing at least any one of carbon dioxide and atomic hydrogen after the forming the first metal film, the silicon carbide layer and the first metal film to form a metal silicide layer containing the metal element; and
    forming a second metal film having a chemical composition different from a chemical composition of the first metal film on the metal silicide layer after performing the heat treating.

2. The method according to claim 1, wherein a temperature of the heat treating is lower than 900° C.

3. The method according to claim 1, wherein a thickness of the metal silicide layer is 50 nm or more and 500 nm or less.

4. The method according to claim 1, further comprising:
    removing unreacted first metal film after forming the metal silicide layer and before forming the second metal film.

5. The method according to claim 1, wherein the atomic hydrogen is produced by a heated catalyst method.

6. The method according to claim 1, wherein the heat treating is performed after the forming the first metal film.

7. The method according to claim 1, wherein the forming the second metal film is performed after performing the heat treating.

8. The method according to claim 1, wherein
the heat treating is performed after the forming the first metal film, and
the forming the second metal film is performed after performing the heat treating.

* * * * *